(12) United States Patent
Shoji et al.

(10) Patent No.: US 11,373,881 B2
(45) Date of Patent: Jun. 28, 2022

(54) RELEASE FILM

(71) Applicant: Toray Industries, Inc., Tokyo (JP)

(72) Inventors: Hideo Shoji, Otsu (JP); Teruya Tanaka, Otsu (JP); Isao Manabe, Otsu (JP)

(73) Assignee: Toray Industries, Inc., Tokyo (JP)

( * ) Notice: Subject to any disclaimer, the term of this patent is extended or adjusted under 35 U.S.C. 154(b) by 252 days.

(21) Appl. No.: 16/763,508

(22) PCT Filed: Dec. 13, 2018

(86) PCT No.: PCT/JP2018/045827
§ 371 (c)(1),
(2) Date: May 12, 2020

(87) PCT Pub. No.: WO2019/131163
PCT Pub. Date: Jul. 4, 2019

(65) Prior Publication Data
US 2020/0335360 A1    Oct. 22, 2020

(30) Foreign Application Priority Data
Dec. 25, 2017 (JP) .............................. JP2017-247267

(51) Int. Cl.
| | | |
|---|---|---|
| H01L 21/56 | (2006.01) | |
| B29C 33/68 | (2006.01) | |
| B29C 43/32 | (2006.01) | |
| B32B 27/08 | (2006.01) | |
| B32B 27/36 | (2006.01) | |
| C08J 5/18 | (2006.01) | |
| C08J 7/043 | (2020.01) | |
| C08J 7/044 | (2020.01) | |
| B29L 31/34 | (2006.01) | |

(52) U.S. Cl.
CPC ............ *H01L 21/566* (2013.01); *B29C 33/68* (2013.01); *B29C 43/32* (2013.01); *B32B 27/08* (2013.01); *B32B 27/36* (2013.01); *C08J 5/18* (2013.01); *C08J 7/043* (2020.01); *C08J 7/044* (2020.01); *B29L 2031/3406* (2013.01); *B32B 2571/00* (2013.01); *C08J 2367/00* (2013.01)

(58) Field of Classification Search
CPC ....... H01L 21/566; B29C 33/68; B29C 43/32; B32B 27/08; B32B 27/36; B32B 2571/00; C08J 5/18; C08J 7/043; C08J 7/044; C08J 2367/00; B29L 2031/3406
See application file for complete search history.

(56) References Cited

U.S. PATENT DOCUMENTS

| | | | |
|---|---|---|---|
| 2009/0186168 A1* | 7/2009 | Nitta ................. | B29C 48/08 428/156 |
| 2018/0186134 A1 | 7/2018 | Imai et al. | |

FOREIGN PATENT DOCUMENTS

| | | | | |
|---|---|---|---|---|
| JP | 2012-224082 A | 11/2012 | | |
| JP | 2016-92272 A | 5/2016 | | |
| JP | 2016-127091 A | 7/2016 | | |
| JP | 2017-13455 A | 1/2017 | | |
| JP | 2017-177463 A | 10/2017 | | |
| JP | 2017-205901 A | 11/2017 | | |
| WO | WO-2017094871 A | * 6/2017 | ............. | B29C 33/68 |

OTHER PUBLICATIONS

Google Patents Translation of WO2017094871A1 (Year: 2022).*

* cited by examiner

*Primary Examiner* — Michael Zhang
(74) *Attorney, Agent, or Firm* — DLA Piper LLP (US)

(57) ABSTRACT

A release film satisfies formulas (I) and (II) when S1 (%) represents the maximum dimensional change rate between 30° C. and 150° C. when the temperature is raised from 30° C. to 200° C. at a rate of 10° C./min, T1 (° C.) represents the temperature at which S1 is obtained, and S0 (%) represents the dimensional change rate at 40° C. The surfaces may have a surface free energy Sa (mN/mm) at 25° C., surface free energy Sb (mN/mm) after having been subjected to a heat treatment at 180° C. for 3 minutes, and surface free energy Sc (mN/mm) after having been stretched by 50% at 180° C. that satisfy formulas (III) and (IV).

| | |
|---|---|
| $0 \leq S1 \leq 1.5$ | Formula (I): |
| $0 \leq |S1-S0|/(T1-40) \leq 0.050$ | Formula (II): |
| $0 \leq |Sa-Sb| \leq 15$ | Formula (III): |
| $0 \leq |Sa-Sc| \leq 15$ | Formula (IV): |

14 Claims, No Drawings

RELEASE FILM

TECHNICAL FIELD

This disclosure relates to a release film that can be suitably used for applications such as a circuit manufacturing process and a semiconductor manufacturing process, and can be particularly suitably used as a release film for a semiconductor sealing process.

BACKGROUND

A semiconductor chip is sealed with a resin for the purpose of protecting it from disturbances such as light, heat, moisture, and physical impact, and is mounted on a substrate as a molded product called a package. To seal the semiconductor chip, a curable resin such as an epoxy resin is used. As a method of sealing a semiconductor chip, a so-called transfer molding method or a compression molding method has been known and, in recent years, introduction of a compression molding method has been promoted against the background of a shape trend such as an increase in area of a semiconductor wafer, a reduction in height of a package, and an increase in the number of pins.

The compression molding method is a method of compressing and curing a molten sealing resin by moving a mold up and down in a heated state. At this time, to ensure releasability between the mold and the sealing resin, a method of inserting a release film therebetween is generally used. As the release film, an ethylene-tetrafluoroethylene copolymer film having excellent releasability, heat resistance, and followability to a mold shape is widely used. However, there is a problem that wrinkles caused by expansion during heating are transferred to a package surface, in which improvement is desired.

To solve such problems, the following films have been proposed.

Although polyester films in which a release layer is laminated described in Japanese Patent Laid-open Publication No. 2016-92272 and Japanese Patent Laid-open Publication No. 2016-127091 use a polyester having a higher dimensional stability compared to the ethylene-tetrafluoroethylene copolymer film, as a base material, the problem that wrinkles are generated during heating described above was not improved. Furthermore, there were problems that releasability was lost at a portion where mold followability or heat resistance was not sufficient and the deformation amount of the film was large, and the film could not be partially peeled.

It could therefore be helpful to provide a release film that can be suitably used for process applications, especially semiconductor sealing process applications, by having characteristics excellent in mold followability and heat resistance, and that suppress wrinkles generated during heating, and releasability does not easily change even after large deformation.

SUMMARY

We thus provide:
(1) A process release film, in which formulas (I) and (II) are satisfied when a maximum dimensional change rate of 30° C. to 150° C. at a time of raising a temperature from 30° C. to 200° C. at 10° C./min, as measured by thermomechanical analysis (TMA), is defined as S1 (%), a temperature at which S1 is given is defined as T1 (° C.), and a dimensional change rate at 40° C. is defined as S0 (%), and in which a surface free energy Sa (mN/mm) at 25° C., a surface free energy Sb (mN/mm) after being subjected to a heat treatment at 180° C. for 3 minutes, and a surface free energy Sc (mN/mm) after elongation of 50% at 180° C. satisfy formulas (III) and (IV) on at least one surface of the film:

$$0 \leq S1 \leq 1.5 \quad \text{(I)}$$

$$0 \leq |S1-S0|/(T1-40) \leq 0.050 \quad \text{(II)}$$

$$0 \leq |Sa-Sb| \leq 15 \quad \text{(III)}$$

$$0 \leq |Sa-Sc| \leq 15 \quad \text{(IV)}.$$

(2) The process release film according to (1), in which a surface elastic modulus on at least one surface as measured using an atomic force microscope is 50 to 3000 MPa.
(3) The process release film according to (1) or (2), in which a root mean square (Rq) of the surface elastic modulus on at least one surface is 50 to 500 MPa.
(4) The process release film according to any one of (1) to (3), in which a maximum temperature of a melting peak (Tm) observed by a differential scanning calorimeter (DSC) is 240° C. or more and 265° C. or less.
(5) The process release film according to any one of (1) to (4), in which a polar force of film surface on at least one surface is 0.1 mN/m or more and 5.0 mN/m or less.
(6) The process release film according to any one of (1) to (5), including a release layer with a thickness of 50 nm or more and 500 nm or less on at least one surface.
(7) The process release film according to any one of (1) to (6), in which a thickness unevenness of the release layer is 50 nm or less.
(8) The process release film according to any one of (1) to (7), in which a surface tear elongation at 180° C. is more than 0% and 30% or less.
(9) The process release film according to any one of (1) to (8), in which a piercing strength is 2 N or more and 10 N or less.
(10) The process release film according to any one of (1) to (9), in which the process release film is a laminated polyester film having a polyester A layer and a polyester B layer having a lower melting point than the polyester A layer, and the polyester A layer and the polyester B layer are alternately laminated 3 layers or more and 1000 layers or less.
(11) The process release film according to any one of (1) to (10), in which the polyester A layer contains a polyester containing at least one copolymer component selected from bisphenol A ethylene oxide, spiroglycol, cyclohexanedicarboxylic acid, and naphthalenedicarboxylic acid, and/or polyetherimide.
(12) The process release film according to any one of (1) to (11), including a polyester A layer with a thickness of 3 μm or more and 10 μm or less within a thickness range of 10 μm or less from an outermost surface of the film.
(13) The process release film according to any one of (1) to (12), which is used for a process film in semiconductor manufacture.
(14) The process release film according to any one of (1) to (13), which is used for semiconductor compression mold molding (compression molding).

The release film can suppress generation of wrinkles during heating since the dimensional change rate and its change when the temperature is raised from 30° C. to 200° C. are small. Also, since the change in surface free energy after heat treatment and heat elongation is small, the release film is excellent in peelability after high-temperature molding and suitable as a release film for a circuit manufacturing process or a semiconductor manufacturing process, and can be particularly suitably used as a release film for a semiconductor sealing process.

DETAILED DESCRIPTION

The release film is a laminated film in which a release layer is laminated on a base film, or a film having releasability on the base film itself.

The release film needs to satisfy formulas (I) and (II) when a maximum dimensional change rate of 30° C. to 150° C. when raising the temperature from 30° C. to 200° C. at 10° C./min as measured by TMA is defined as S1, a temperature at which S1 is given is defined as T1, and a dimensional change rate at 40° C. is defined as S0.

$$0 \le S1 \le 1.5 \quad (I)$$

$$0 \le |S1-S0|/(T1-40) \le 0.050 \quad (II)$$

In the compression molding method, in the process of bringing the release film into contact with a high-temperature mold from a normal temperature state and vacuum-sucking the release film to form it into the mold shape, the release film expands in a temperature rising process, and generated wrinkles may be transferred to the package. Further, even when a film having a high dimensional stability such as a biaxially stretched film is used, expansion in a low-temperature region is not sufficiently suppressed, and wrinkles generated in the temperature rising process may be similarly transferred. Therefore, we found that, by setting the dimensional change rate of 30° C. to 150° C. corresponding to the temperature change in the mold to a specific range shown in formula (I), and setting the dimensional change in the temperature range to a specific range shown in formula (II), it is possible to suppress generation of wrinkles during temperature rising and obtain a product with good appearance. Formula (I) more preferably satisfies formula (I') and most preferably satisfies formula (I'').

$$0 \le S1 \le 1.0 \quad (I')$$

$$0 \le S1 \le 0.7 \quad (I'')$$

Further, formula (II) more preferably satisfies formula (II') and most preferably satisfies formula (II'').

$$0 \le |S1-S0|/(T1-40) \le 0.025 \quad (II')$$

$$0 \le |S1-S0|/(T1-40) \le 0.010 \quad (II'')$$

The method by which the release film satisfies formulas (I) and (II), and examples thereof include a method of continuously applying process A of applying a tension of 0.5 MPa or more and 5 MPa or less in a film transport direction at a temperature (Ta) of 70° C. or more and 150° C. or less in a release film manufacturing process and process B of applying a tension of 0.5 MPa or more and 5 MPa or less at a temperature (Tb) of Ta+5° C. or more and Ta+20° C. or less and the like. The molecular chains oriented by application of tension in the temperature region are relaxed in the temperature rising process during molding, and the dimensional change is directed in the contraction direction, whereby expansion can be suppressed in some instances. In addition, relaxation and contraction occur gradually by applying tension in a gradual temperature gradient, whereby wrinkling due to contraction deformation can be suppressed in some instances. In the method of producing the release film, when the stretching tension of the base film is high, orientation of the molecular chains by applying tension may not be sufficiently imparted, and 10% stretching stress at 150° C. in the MD direction of the base film is preferably 1 MPa or more and 30 MPa or less. It is more preferably 1 MPa or more and 25 MPa or less, and most preferably 1 MPa or more and 20 MPa or less.

Surface free energy Sa at 25° C., surface free energy Sb after being subjected to a heat treatment at 180° C. for 3 minutes and surface free energy Sc after elongation of 50% at 180° C. need to satisfy formulas (III) and (IV) on at least one surface of the film.

$$0 \le |Sa-Sb| \le 15 \quad (III)$$

$$0 \le |Sa-Sc| \le 15 \quad (IV)$$

Formulas (III) and (IV) mean that value changes before and after processes are small, with respect to the surface free energy after heat treatment at 180° C. and after elongation process of 50% at 180° C. In a conventional release film, release properties are impaired after molding, due to denaturation at a high temperature and deformation of the surface of the release film due to deformation, which may result in poor peeling. Further, in recent years, followability to a mold shape with a deeper package thickness has been required, and there have been instances when mold release failure at an acute angle portion has become a problem. Since the change in the surface free energy change at high temperature and large deformation is small, with regard to formula (III) characterized in that release properties are unaffected by the molded shape and stable, our film more preferably satisfies formula (III'), and most preferably satisfies formula (III'').

$$0.5 \le |Sa-Sb| \le 13 \quad (III')$$

$$0.5 \le |Sa-Sb| \le 11 \quad (III'')$$

Further, formula (IV) more preferably satisfies formula (IV') and most preferably satisfies formula (IV'').

$$1.0 \le |Sa-Sc| \le 13 \quad (IV')$$

$$1.0 \le |Sa-Sc| \le 11 \quad (IV'')$$

As described above, it is preferable that the surface energy change at high temperature and large deformation is small, but we confirmed that when the surface energy slightly increases or decreases, the energy difference between the generated peeling interfaces becomes a strain, and peelability tends to be improved. Therefore, as shown in formulas (III'), (III''), (IV'), and (IV''), the preferable range of the surface energy change has a lower limit. The method by which the release film satisfies formulas (III) and (IV) is not particularly limited, and examples thereof include a method of providing a release layer with a thickness of 50 nm or more and 500 nm or less on the base film and the like. It is presumed that reducing the thickness of the release layer to 500 nm or less reduces deformation stress of the release layer and causes the release layer to be uniformly deformed, thereby producing an effect of suppressing generation of cracks and thickness unevenness. On the other hand, when the thickness of the release layer is less than 50 nm, it is difficult to form the release layer uniformly, and the change in surface energy due to heating and elongation tends to be large.

The release film preferably has a surface elastic modulus on at least one surface as measured using an atomic force microscope of 50 MPa or more and 3000 MPa or less. When the surface elastic modulus of the release film is larger than 3000 MPa, cracks on the surface are likely to occur during molding, and releasability may be locally impaired. Also, when it is less than 50 MPa, flow marks of the resin may be transferred to the surface of the release film, and quality of the package surface after transfer may be degraded. The surface elastic modulus is more preferably 300 MPa or more and 2500 MPa or less, and most preferably 500 MPa or more and 2000 MPa or less. The method of setting the surface elastic modulus to 50 MPa or more and 3000 MPa or less is not particularly limited, and examples thereof include a method of incorporating a crosslinking agent into the release layer composition and the like.

The release film preferably has a root mean square (Rq) of the surface elastic modulus on at least one surface of 50 MPa or more and 500 MPa or less. When the Rq is larger than 500 MPa, variation of the surface elastic modulus is large and molding stress distribution becomes non-uniform. Therefore, when having a thin film release layer, variation of the layer thickness may be increased by molding, and in-plane release properties may be non-uniform. The lower Rq, the better, but it is difficult to make it less than 50 MPa by a general manufacturing method. The Rq is more preferably 50 MPa or more and 400 MPa or less, and most preferably 50 MPa or more and 300 MPa or less. Examples of a method of setting Rq to the above specific ranges include a method in which elongation of 0.1% or more and 10% or less is performed stepwise in a drying process during processing of the release layer and the like. Performing extension stepwise means performing extension in a plurality of different temperature zones, and the extension magnification means the sum of the magnifications of all zones. By performing a stretching process at a minute magnification of the release layer, variation in the surface elastic modulus can be reduced. In addition, by performing extension stepwise, stress concentration on the release layer during curing can be reduced, and breakage and reduction in adhesion of the release layer can be suppressed. When the extension rate is less than 0.1%, an effect of reducing the variation in the surface elastic modulus is small, and when the stretching rate is larger than 10%, moldability of the film may be deteriorated or releasability may be deteriorated by tear of the release layer. The stretching rate is preferably 0.4% or more and 8.5% or less, and most preferably 0.7% or more and 7.5% or less.

The release film preferably has a maximum temperature of the melting peak (Tm) observed by a differential scanning calorimeter (DSC) of 240° C. or more and 265° C. or less. In recent years, adoption of high-temperature molding resins has been increasing from the viewpoint of heat resistance of chips, and heat resistance requirements for release films tend to be higher. Therefore, the Tm is preferably 240° C. or more. The Tm is preferably as high as possible, but is preferably 265° C. or less from the viewpoint of achieving both moldability. The Tm is more preferably 243° C. or more and 265° C. or less, and most preferably 246° C. or more and 265° C. or less.

The release film preferably has a polar force of film surface on at least one surface of 0.1 mN/m or more and 5.0 mN/m or less. The polar force refers to a value calculated by a measurement method described later. When the polar force of film surface is smaller than 0.1 mN/m, the molten resin is repelled on the film surface, leveling may be insufficient, and transfer appearance may be deteriorated. In addition, when the polar force of film surface is larger than 5.0 mN/m, adhesion to the release film becomes excessive, and the film is not peeled in the peeling process, or the film is broken or adhered, and it may be difficult to maintain process stability. The polar force of film surface is more preferably 0.4 mN/m or more and 4 mN/m or less, and most preferably 0.8 mN/m or more and 3 mN/m or less. Examples of a method of setting the polar force of film surface to 0.1 mN/m or more and 5 mN/m or less include a method using an additive described later as a resin composition for forming a release layer. In particular, a long-chain alkyl group-containing compound is preferably used because it has good followability during extension in the release layer processing.

The release film preferably has a release layer with a thickness of 50 nm or more and 500 nm or less on at least one surface. By having a thin film release layer, the deformation stress of the release layer is reduced and the release layer is uniformly deformed, and an effect of suppressing generation of cracks and thickness unevenness is produced. The thickness of the release layer is more preferably 70 nm or more and 400 nm or less, and most preferably 90 nm or more and 300 nm or less.

The thickness unevenness of the release layer is preferably 50 nm or less. The thickness unevenness of the release layer has a large effect on the releasability when designing a thin film with a thickness of 200 nm or less, and when the thickness unevenness is larger than 50 nm, heavy peeling at a local thin film portion, cohesive failure of the release layer, and peeling marks due to zipping resulting from uneven peeling force with a thick film portion are likely to occur. In addition, since the sealing resin to be peeled when using a release film in the semiconductor sealing process generally contains a large amount of large-diameter particles, the surface becomes an irregular shape, which is not uniform. Therefore, there is a tendency that an influence of thickness unevenness of the release layer is enlarged and appears. By reducing the thickness unevenness of the release layer, it is possible to reduce the influence of these factors that deteriorate peelability, and to impart characteristics particularly suitable as a release film for a semiconductor sealing process. The thickness unevenness of the release layer is more preferably 40 nm or less, and most preferably 30 nm or less. The method of setting the thickness unevenness of the release layer to a preferable range is not particularly limited, and examples thereof include a method in which elongation of 1.0% or more and 5% or less is performed in a drying process during processing of the release layer and the like. At this time, when elongation is performed in a plurality of zones, the total elongation magnification is preferably in the above range. Thickness unevenness of a coating film is often larger in the MD direction than in the TD direction, as a result of influences of MD thickness unevenness of the film itself due to cast, roll sticking and ejection fluctuation, and application unevenness due to fine vibration of a coater and the like. However, by performing the above process of transporting the release layer coating liquid under a specific speed condition before preheating and drying, the coating liquid easily spreads also in the MD direction along with an accompanying airflow of the film transport, whereby the thickness unevenness can be reduced in some instances.

The surface tear elongation at 180° C. is preferably more than 0% and 30% or less. The surface tear elongation at 180° C. means elongation at which an outermost surface layer is torn after stretching at 180° C. We found that, by causing tearing by stretching on the outermost surface of the release film, appearance unevenness of the resin surface after sealing may be good. Although the principle is not clear, we believe that improvement in leveling properties of the sealing resin due to fine irregularities of the film and appearance improvement by transfer of the fine irregular shape to the resin surface were successful. The surface tear elongation at 180° C. is more preferably 3% or more and 25% or less, and most preferably 3% or more and 20% or less. When the surface tear elongation exceeds 30%, the effect may not be exhibited in the semiconductor sealing process, and when the surface tear elongation is 0%, that is, tearing has occurred compared to the time of film formation, it is not preferable because the release layer is likely to be scraped in a transport process. Examples of a method of setting the surface tear elongation at 180° C. to the above preferable ranges include a method in which the maximum temperature of heating in the coating, drying, and curing processes of the release layer is 100° C. or less and the like. By using the low-temperature condition, and applying to an actual forming (stretching) process in a state where the cross-linking has not been completed, it is possible to complete the cross-linking by heating in the formation process and cause tearing by stretching, and also suppress the occurrence of tearing due to transport tension of the film at the time of film formation. Examples of a configuration of the release film include a base film having releasability, and a configuration of a laminated film in which a release layer having releasability is laminated on the base film. A configuration in which a release layer is laminated on a base film is preferable because of an advantage in which releasability can be controlled in accordance with the sealing resin.

The resin used for the base film is not particularly limited as long as the desired effects are not impaired. For example, polyesters such as polyethylene terephthalate, polybutylene terephthalate and polyethylene naphthalate, polyarylate, polyethylene, polypropylene, polyamide, polyimide, polymethylpentene, polyvinyl chloride, polystyrene, polymethyl methacrylate, polycarbonate, polyetheretherketone, polysulfone, polyethersulfone, fluororesin, polyetherimide, polyphenylenesulfide, polyurethane and a cyclic olefin resin and the like can be used singly or in combination of a plurality thereof. Among them, polyesters such as polyethylene terephthalate and polybutylene terephthalate are preferably used, from the viewpoint of handleability and dimensional stability of the film, and economic efficiency during production.

The polyester is a generic term for polymers having a main bond in a main chain as an ester bond. Usually, the polyester can be obtained by subjecting a dicarboxylic acid component and a glycol component to a polycondensation reaction.

The dicarboxylic acid component to obtain the polyester is not particularly limited as long as the desired effects are not impaired. For example, each component such as an aromatic dicarboxylic acid such as terephthalic acid, isophthalic acid, phthalic acid, 2,6-naphthalenedicarboxylic acid, diphenyl dicarboxylic acid, diphenylsulfonedicarboxylic acid, diphenoxyethanedicarboxylic acid, 5-sodium-sulfonedicarboxylic acid or 9,9'-bis(4-carboxyphenyl)fluorenic acid, an aliphatic dicarboxylic acid such as oxalic acid, succinic acid, adipic acid, sebacic acid, dimeric acid, maleic acid or fumaric acid, an alicyclic dicarboxylic acid such as 1,4-cyclohexanedicarboxylic acid, or an oxycarboxylic acid such as paraoxybenzoic acid can be used. Moreover, the dicarboxylic acid component may be a dicarboxylic acid ester derivative component, and each component such as an esterified product of the dicarboxylic acid compound, for example, dimethyl terephthalate, diethyl terephthalate, 2-hydroxyethyl methyl terephthalate, dimethyl 2,6-naphthalenedicarboxylate, dimethyl isophthalate, dimethyl adipate, diethyl maleate or dimethyl dimer can also be used.

Further, the glycol component to obtain the polyester is not particularly limited as long as the desired effects are not impaired. For example, each component such as an aliphatic dihydroxy compound such as ethylene glycol, 1,2-propanediol, 1,3-propanediol, 1,3-butanediol, 1,4-butanediol, 1,5-pentanediol, 1,6-hexanediol or 2,2-dimethyl-1,3-propanediol, a polyoxyalkylene glycol such as diethylene glycol, polyethylene glycol, polypropylene glycol or polytetramethylene glycol, an alicyclic dihydroxy compound such as 1,4-cyclohexanedimethanol, isosorbate, 9,9'-bis(4-carboxyphenyl) fluorene or spiroglycol, or an aromatic dihydroxy compound such as bisphenol A or bisphenol S can be used. Among them, it is preferable to use each component of ethylene glycol, 1,4-butanediol, 2,2-dimethyl-1,3-propanediol, 1,4-cyclohexanedimethanol, and polytetramethylene glycol, from the viewpoint of achieving both flexibility and heat resistance, and handleability.

These dicarboxylic acid components and glycol components may be used in combination of two or more types as long as the desired effects are not impaired.

Examples of polyolefins that can be preferably used include propylene homopolymers exhibiting isotactic or syndiotactic stereoregularity, propylene/α-olefin copolymers and the like. Specific examples of the α-olefin include ethylene, butene-1, hexene-1, heptene-1,4-methylpentene-1 and the like. The propylene/α-olefin copolymer preferably contains more than 50 mol % of propylene units when all constituent units constituting the polymer are 100 mol %. Moreover, the propylene/α-olefin copolymer may be any of a binary system, a ternary system and a quaternary system as long as the desired effects are not impaired, and may be either of a random copolymer and a block copolymer.

The base film of the release film may be a single-layer film or a laminated film of two or more layers. In a three-layer structure, it is preferable to make the composition of both surface layers the same, from the viewpoint of productivity. Furthermore, to improve productivity, it is preferable to make the lamination thickness of both surface layers the same. Further, to improve heat resistance of the base film, the maximum temperature of the melting peak (Tms) observed by a differential scanning calorimeter (DSC) of both surface layers is preferably 248° C. or more and 265° C. or less. It is more preferably 250° C. or more and 265° C. or less, and most preferably 253° C. or more and 265° C. or less.

The piercing strength is preferably 2 N or more and 10 N or less. In the semiconductor sealing process, the release film may be used with opening a hole for vacuum suction of a wafer in some instances, and when the piercing strength is 10 N or less, a uniform hole is easily formed, which is preferable. On the other hand, when the piercing strength is less than 2 N, a hole is opened at an unintended position due to pressing of mold projection against the release film or the like, and a sufficient degree of vacuum cannot be maintained in some instances, which is not preferable. The method of setting the piercing strength to the above preferable range is not particularly limited, and examples thereof include a method of, in the production process of a biaxially stretched polyester film, setting the ratio in each stretching direction to 2.8 times or more and 3.8 times or less, and providing a difference in stretch ratio of 0.7 times or more and 1.0 times or less in each stretching direction and the like. In general, the piercing strength is correlated with the degree of molecular orientation in the polymer film, but it is possible to maintain appropriate mechanical properties as a process film while controlling the piercing strength in a good range, by forming a low orientation direction in the film plane by unbalancing the stretch ratio. The piercing strength is more preferably 3 N or more and 7 N or less.

The release film is preferably a laminated polyester film having a polyester A layer and a polyester B layer having a lower melting point than the polyester A layer, in which the A layer and the B layer are alternately laminated at least 3 layers or more and 1,000 layers or less. The A layer of high melting point functions as a heat-resistant layer, especially in the semiconductor sealing process, and contributes to suppress film deformation due to shear heat generated by a flow of the sealing resin, and to suppress mold release failure caused by deformation of the surface layer due to shearing. Further, the B layer of low melting point functions as a flexible layer, and can improve moldability of the film. The polyester A layer preferably contains a polyester containing at least one copolymer component selected from spiroglycol, isosorbide, fluorene, cyclohexanedicarboxylic acid, and naphthalenedicarboxylic acid component, and/or polyetherimide. By incorporating these specific polyesters or polyetherimides, it is possible to effectively suppress the film deformation due to shear heat generated by resin flow in the semiconductor sealing process. In addition, the specific polyester or polyetherimide has a high glass transition temperature or a high melting point, but even in a laminated structure with a flexible polyester B layer, interfacial peeling during biaxial stretching hardly occurs, and lowering in productivity due to breakage, uneven film appearance or the like can be improved in some instances.

The release film preferably has a polyester A layer with a thickness of 3 μm or more and 10 μm or less within a thickness range of 10 μm or less from the outermost surface of the film. By locating the polyester A layer in the vicinity of the outermost surface of the film in a specific thickness range, it is possible to more effectively suppress the film deformation due to shear heat generated by resin flow in the semiconductor sealing process. The thickness of the polyester A layer is more preferably 4 μm or more and 9 μm or less, and most preferably 5 μm or more and 8 μm or less. When the thickness of the polyester A layer is smaller than 3 μm, the effect of suppressing the film deformation tends to be insufficient, and when it is larger than 10 μm, moldability may be insufficient, thus it is not preferable. When a plurality of polyester A layers exist in a range of 10 μm or less from the outermost surface of the film, the total thickness is preferably in the above ranges. In addition, from the viewpoint of achieving both the film deformation suppression and moldability, it is also a more preferable configuration that two or more polyester A layers are located within 10 μm or less from the outermost surface of the film. By being divided into a plurality of layers, the effect of suppressing the film deformation can be exhibited without impairing the moldability.

The base film is preferably a biaxially oriented film from the viewpoint of controlling a dimensional change in a mold. A biaxially oriented film can be obtained by performing stretching by a sequential biaxial stretching method in which an unstretched film is stretched in a longitudinal direction and then stretched in a width direction, or stretched in the width direction and then stretched in the longitudinal direction, by a simultaneous biaxial stretching method in which stretching is performed substantially simultaneously in the longitudinal direction and the width direction of the film or the like.

The stretch ratio in such stretching methods adopts 2.8 times or more and 3.4 times or less, and further preferably 2.9 times or more and 3.3 times or less in the longitudinal direction. Moreover, the stretching speed is desirably 1,000%/min or more and 200,000%/min or less. Further, the stretching temperature in the longitudinal direction is preferably 70° C. or more and 90° C. or less. Also, the stretch ratio in the width direction adopts preferably 2.8 times or more and 3.8 times or less, and further preferably 3 times or more and 3.6 times or less. The stretching speed in the width direction is desirably 1,000%/min or more and 200,000%/min or less.

Further, the film is subjected to heat treatment after biaxial stretching. The heat treatment can be performed by any conventionally known method such as in an oven or on a heated roll. This heat treatment is preferably performed at a temperature of −40° C. or more and −5° C. or less from crystal melting peak temperature (Tm) of the film. When the heat treatment temperature is lower than Tm−40° C., the degree of molecular orientation becomes too high. Therefore, followability to a mold shape may be insufficient, or wrinkles may be generated in the mold due to large contraction during heating and transferred to the package surface. Further, when the heat treatment temperature is higher than Tm−5° C., crystallization may proceed excessively and mold followability may be insufficient. The heat treatment temperature is further preferably Tm−34° C. or more and Tm−8° C. or less, and most preferably Tm−32° C. or more and Tm−12° C. or less. The heat treatment time can be arbitrarily set as long as the properties are not deteriorated, and the heat treatment is performed for preferably 5 seconds or more and 60 seconds or less, more preferably 10 seconds or more and 40 seconds or less, and most preferably 15 seconds or more and 30 seconds or less.

Next, a method of providing a release layer on the base film will be described, and this disclosure is not construed as being limited to these examples.

The release layer can be laminated on one surface or both surfaces of the base film. When a release layer is laminated on one surface, an antistatic layer may be laminated on a surface on the opposite side. The antistatic layer can contain, for example, an antistatic agent such as carbon black, tin oxide, antimony-doped tin dioxide, polythiophene or polyaniline. In consideration of transparency, a tin oxide-based antistatic agent is preferred.

When the release layer contains a binder resin, adhesion to the base film is improved and peeling force with an object to be peeled can be adjusted, thus it is preferable. Specific examples of the binder resin include polyester resins, acrylic resins, urethane resins, polyvinyl, polyalkylene glycols, polyalkyleneimines, celluloses, starches and the like, and an acrylic resin is preferably used from the viewpoint of mold followability and peel force control.

Examples of the acrylic resin include homopolymers or copolymers of a (meth)acrylic acid alkyl ester, and (meth)acrylic acid ester copolymers having a curable functional group in a side chain and/or a main chain terminal, and examples of the curable functional group include a hydroxyl group, a carboxyl group, an epoxy group, an amino group and the like. Among them, an acrylic monomer copolymer obtained by copolymerizing an acrylic monomer and an acrylic acid ester having a curable functional group in the side chain and/or a main chain terminal is preferable.

Further, it is preferable to add a crosslinking agent as a component constituting the release layer. By using various crosslinking agents in combination with the above-described resin, heat resistance can be dramatically improved. The crosslinking agent is preferably an oxazoline resin, a melamine resin, an epoxy resin, a carbodiimide resin, or an isocyanate resin. A melamine resin is further preferably used from the viewpoint of durability of the release layer to a solvent. The crosslinking agent can be used by mixing at an arbitrary ratio, but the crosslinking agent is preferably added in an amount of 5 to 50 parts by weight based on 100 parts by weight of the binder resin from the viewpoint of improving heat resistance, and more preferably 10 to 40 parts by weight. When the added amount of the crosslinking agent is less than 5 parts by weight, the effect of improving heat resistance may be insufficient, or scratches may occur during roll transport. On the other hand, when the added amount of the crosslinking agent exceeds 50 parts by weight, spots are likely to occur during application, thus it is not preferable.

The resin composition forming the release layer preferably contains an additive suitable for imparting peelability, in addition to the binder resin and the crosslinking agent. The additive is preferably 3 parts by mass or more and 50 parts by mass or less when the sum of the masses of the binder resin and the crosslinking agent is 100 parts by mass. When the mass of the additive is 3 parts by mass or more, peelability can be imparted, and when it is 50 parts by mass or less, sufficient heat resistance can be imparted. It is preferably 10 parts by mass or more and 42 parts by mass or less, and most preferably 20 parts by mass or more and 34 parts by mass or less.

The additive refers to a compound having peelable (that is, that reduces the surface free energy of the resin or reduces a coefficient of static friction of the resin) properties on the surface of the resin by being added to the resin.

Examples of the additives that can be used include silicone-containing compounds, fluorine compounds, waxes such as paraffin wax, polyethylene wax and carnauba wax, compounds containing long-chain alkyl groups, resins and the like. Among them, a compound containing long-chain alkyl chains is preferable in terms of achieving both peelability and heat resistance. The long-chain alkyl compound refers to a compound having long-chain alkyl groups, and is not particularly limited as long as it is a compound containing a long-chain alkyl group, but includes compounds having a long-chain alkyl group in a side chain of a main chain polymer.

In the compound having a long-chain alkyl group in the side chain of the main chain polymer, examples of the main chain polymer include acrylate-based polymers or copolymers, polyvinyl alcohols (also including partially saponified polyvinyl acetate), ethylene-vinyl alcohol copolymers (also including partially saponified ethylene-vinyl acetate copolymers), vinyl alcohol-acrylic acid copolymers (also including partially saponified vinyl acetate-acrylic acid copolymers), polyethylimine, polyvinylamine, styrene-maleic anhydride copolymers, polyurethane and the like.

The fluorine compound is a compound containing a fluorine atom in the compound. Examples thereof include perfluoroalkyl group-containing compounds, polymers of an olefin compound containing a fluorine atom, aromatic fluorine compounds such as fluorobenzene and the like. In the compression molding method, a high heat load is applied to the release film. Therefore, in consideration of heat resistance and contamination properties, the fluorine compound is preferably a polymer compound.

The wax is selected from natural waxes, synthetic waxes, and waxes containing these waxes. The natural waxes are vegetable waxes, animal waxes, mineral waxes, and petroleum waxes. Examples of the vegetable wax include candelilla wax, carnauba wax, rice wax, wood wax, and jojoba oil. Examples of the animal wax include beeswax, lanolin, and whale wax. Examples of the mineral wax include montan wax, ozokerite, and ceresin. Examples of the petroleum wax include paraffin wax, microcrystalline wax, and petrolatum. Examples of the synthetic wax include synthetic hydrocarbon, modified wax, hydrogenated wax, fatty acid, acid amide, amine, imide, ester, and ketone. As the synthetic hydrocarbons, Fischer-Tropsch wax (also known as Sazoir wax) and polyethylene wax are known, but in addition to these, following polymers that are low molecular weight polymers (specifically, polymers having a viscosity average molecular weight of 500 to 20,000) are also included. That is, there are polypropylene, ethylene/acrylic acid copolymers, polyethylene glycol, polypropylene glycol, and a block or graft conjugate of polyethylene glycol and polypropylene glycol. Examples of the modified wax include montan wax derivatives, paraffin wax derivatives, and microcrystalline wax derivatives. The derivative herein is a compound obtained by any of purification, oxidation, esterification and saponification, or a combination thereof. Examples of the hydrogenated wax include hardened castor oil, and hardened castor oil derivatives.

Further, the resin constituting the release layer may contain inert particles for the purpose of improving fixability and slipperiness of the release layer. Specific examples of the inert particles include silica, alumina, kaolin, calcium carbonate, titanium oxide, organic particles and the like.

Furthermore, an antifoaming agent, a coating improver, a thickener, an organic lubricant, an antistatic agent, an antioxidant, an ultraviolet absorber, a foaming agent, a dye and the like may be contained, as necessary, in a range in which the desired effects are not impaired.

When the resin composition that forms the release layer is provided on the base film, a solvent may be used. That is, the resin composition may be dissolved or dispersed in a solvent to form a coating liquid that may be applied to the base film. After application, the solvent is dried and heated to obtain a laminated film on which the release layer is laminated.

As a method of forming the release layer on the base film, a method of uniformly applying with a metaling bar or a gravure roll and then drying in an oven is preferable. When applying by a coating method such as a gravure coating method, it is preferable to coat the release layer to not hinder flow and flattening (leveling) of a coating layer. The oven temperature is preferably 70 to 245° C., more preferably 80 to 235° C., and most preferably 90 to 225° C. When the drying temperature is lower than 70° C., curing of the release layer does not proceed sufficiently, and the base film and the release layer may not adhere. Moreover, when the temperature is higher than 245° C., coating thickness accuracy may decrease due to thermal deformation of the film. The heat treatment time is preferably 1 to 60 seconds, more preferably 5 to 40 seconds, and most preferably 10 to 30 seconds. The drying process of the release layer is preferably performed at a temperature of 70 to 150° C. under a tension of 0.5 MPa or more and 5 MPa or less, from the viewpoint of controlling a dimensional change in a temperature rising process during compression molding. In the drying process of the release layer, which is the final process of heat history in the release film, expansion deformation during temperature rising in compression molding can be suppressed by remaining molecular chain distortion due to minute tension. The tension in the drying process is preferably 0.8 MPa or more and 3 MPa or less, and most preferably 1.2 MPa or more and 3 MPa or less. When the tension in the drying process is smaller than 0.5 MPa, the effect of suppressing expansion deformation may not be exhibited, and when it is larger than 5 MPa, contraction is large during heating in compression molding and wrinkles may be generated in the release film, and followability to the shape of the mold may be reduced.

It is possible to provide the release layer by in-line coating to secure stable releasability. As a method of providing a coating layer in-line in a film manufacturing process, a method of uniformly applying a coating layer composition dispersed in water on an at least uniaxially stretched film using a metaling bar, a gravure roll or the like, and drying a coating agent while performing stretching is preferable. In this example, the thickness of the release layer is preferably 50 nm or more and 200 nm or less after drying. By performing the stretching process after application of the coating composition, the thickness of the release layer can be made more uniform. In addition, by the heat treatment at a higher temperature than that of off-line coating, the degree of curing of the coating film is increased to improve heat resistance and chemical resistance and, at the same time, there is an advantage that aging treatment after production is unnecessary or can be shortened. Various additives, for example, an antioxidant, a heat-resistant stabilizer, an ultraviolet absorber, an infrared absorber, a pigment, a dye, organic or inorganic particles, an antistatic agent, a nucleating agent and the like may be added to the release layer.

The release film can suppress generation of wrinkles during heating since the dimensional change rate and its change when the temperature is raised from room temperature to 180° C. are small. Also, since the change in surface free energy at 150° C. after heat treatment and heat stretching is small, the release film is excellent in peelability after high-temperature molding and suitable as a release film for a circuit manufacturing process or a semiconductor manufacturing process, and can be particularly suitably used as a release film for a semiconductor sealing process.

EXAMPLES (1) Composition of Polyester

The polyester resin and the film are dissolved in hexafluoroisopropanol (HFIP), and the content of each monomer residue component and by-product diethylene glycol can be quantified using $^1$H-NMR and $^{13}$C-NMR. In a laminated film, components constituting each layer alone can be collected and evaluated by scraping each layer of the film, according to the lamination thickness. In addition, with respect to the film, the composition was calculated by calculation from the mixing ratio during film production.

(2) Intrinsic Viscosity of Polyester

After dissolving polyester in o-chlorophenol, limiting viscosities of the polyester resin and the film were measured at 25° C. using an Ostwald viscometer. In a laminated film, the intrinsic viscosity of each layer alone can be evaluated by scraping each layer of the film according to the lamination thickness.

(3) Film Thickness, Layer Thickness

The film was embedded in an epoxy resin, and a cross section of the film was cut out by a microtome. The cross section was observed with a transmission electron microscope (TEM H7100 manufactured by Hitachi, Ltd.) at a magnification of 5000 times, and the film thickness and the thickness of the polyester layer were determined.

(4) Melting Point (Tm), Melting Point of Surface Layer (Tms)

Using a differential scanning calorimeter (manufactured by Seiko EG&G Co., Ltd., RDC220), measurement and analysis were performed according to JIS K7121-1987 and JIS K7122-1987. Using 5 mg of a polyester film as a sample, the temperature at the top of an endothermic peak obtained on a DSC curve for a temperature rise from 25° C. to 300° C. at 20° C./min was determined as a melting point. When there were a plurality of endothermic peaks, the peak temperature of the endothermic peak on the highest temperature side was determined as the melting point. In a laminated film, the melting point of each layer alone can be measured by scraping each layer of the film according to the lamination thickness.

(5) Dimensional Change Rate (TMA)

A sample was prepared by cutting a film into a rectangle of 50 mm in length×4 mm in width in the MD direction and TD direction. The temperature was raised under the following conditions, using a thermomechanical analyzer (TMA EXSTAR6000, manufactured by Seiko Instrument, Inc.), and maximum dimensional change rate S1 at 30° C. to 150° C., temperature T1 giving S1, and the dimensional change rate S0 at 40° C. were measured.

Test length: 15 mm, load: 19.6 mN, temperature rising rate: 10° C./min,

Measurement temperature range: 30 to 200° C.

Dimensional change rate at temperature T(° C.) (%)=[{Film length at temperature T (mm)−Film length at 30° C. (mm)]/Film length at 30° C. (mm)]×100

The measurement was performed five times each in the MD and TD directions while changing the sampling position, and the average values of values of formula (I) and formula (II) calculated from S1, T1 and S0 obtained by measurements in each direction were adopted as values in each direction.

(6) Surface Free Energy Sa, Polar Force

A surface free energy of the film and a polar force component in the surface free energy were determined as follows. First, equation (i) was derived from the extended Fowkes' equation and Young's equation.

$$\gamma SL = \gamma S + \gamma L - 2(\gamma sd \cdot \gamma Ld)^{1/2} - 2(\gamma sD \cdot \gamma LD)^{1/2} - 2(\gamma sh \cdot \gamma Lh)^{1/2} \quad \text{Extended Fowkes' equation}$$

$$\gamma S = \gamma SL + \gamma L \cos\theta \quad \text{Young's equation}$$

γS: Surface free energy of solid
γL: Surface tension of liquid
γSL: Solid-liquid interface tension
θ: Contact angle with liquid
γsd, γLd: Dispersion force components of γS, γL
γsD, γLD: Polar force components of γS, γL
γsh, γhL: Hydrogen bond components of γS, γL $$(\gamma sd \cdot \gamma Ld)^{1/2} + (\gamma sD \cdot \gamma LD)^{1/2} + (\gamma sh \cdot \gamma Lh)^{1/2} = \gamma L(1+\cos\theta)/2 \quad (i)$$

Next, with respect to four types of liquids whose surface tension components were known, a contact angle with the film was measured, substituted into equation (i), and ternary linear equations for each liquid were solved to determine a polar force component in the surface free energy of the film. Numerical calculation software "Mathematica" was used to solve the simultaneous equations. Further, the contact angle was measured using measuring liquids of water, ethylene glycol, formamide and methylene iodide, and a contact angle meter CA-D manufactured by Kyowa Interface Science Co., Ltd. was used as a measuring machine. The measurement was performed on both surfaces (surface I/surface II) of the film in an environment of 25° C. and 65% humidity, with N=3, respectively, and the average values thereof were adopted as the values of each surface.

(7) Surface Free Energy Sb after Being Subjected to Heat Treatment at 180° C. for 3 Minutes A film was allowed to stand in an oven set at 180° C. for 3 minutes. Thereafter, the heat-treated film was taken out of the oven, and the surface free energy was measured by the method described in (6).

The measurement was performed on both surfaces (surface I/surface II) of the film in an environment of 25° C. and 65% humidity, with N=3, respectively, and the average values thereof were adopted as the values of each surface.

(8) Surface Free Energy Sc after Elongation of 50% at 180° C.

A direction of the main orientation axis direction at an arbitrary position on the film was defined as a TD direction, and a direction orthogonal to the TD direction was defined as an MD direction. Then, a sample was prepared by cutting the film into a rectangle of 150 mm in length×30 mm in width in the MD direction and TD direction, respectively. Using a tensile tester (Tensilon UCT-100 manufactured by Orientec Co., Ltd.), the film sample is elongated 50% in the longitudinal direction, at an initial tensile chuck distance of 50 mm and a tensile speed of 300 mm/min. The film sample was set in a thermostat set at 180° C. in advance, and the elongation was performed after preheating for 90 seconds. Thereafter, the elongated film sample was taken out of the thermostat, and the surface free energy was measured by the method described in (6). The measurement was performed on both surfaces (surface I/surface II) of the film in an environment of 25° C. and 65% humidity, with N=3, respectively, and the average values thereof were adopted as the values of each surface.

(9) Surface Elastic Modulus

Using AFM (DimensionIcon manufactured by Bruker Corporation), measurement was performed in PeakForce QNM mode, and analysis based on JKR contact theory was performed from the obtained force curve, using an attached analysis software "NanoScopeAnalysis V1.40", to determine an elastic modulus distribution.

Specifically, after configuration of warpage sensitivity, spring constant and tip curvature of a cantilever in accordance with a PeakForce QNM mode manual, measurement was performed under the following conditions, and the obtained DMT Modulus channel data was adopted as the surface elastic modulus. The spring constant and tip curvature vary depending on the individual cantilever, but as a range that does not affect the measurement, a cantilever satisfying conditions of a spring constant of 0.3 (N/m) or more and 0.5 (N/m) or less and a tip curvature radius of 15 (nm) or less was adopted and used for measurement.

The measurement conditions are shown below.
Measuring device: Atomic force microscope (AFM) manufactured by Bruker Corporation
Measurement mode: PeakForce QNM (force curve method)
Cantilever: SCANASYST-AIR manufactured by Bruker AXS GmbH
(Material: Si, spring constant K: 0.4 (N/m), tip curvature radius R: 2 (nm))
Measurement atmosphere: 23° C., in air
Measuring range: 3 (μm) square
Resolution: 512×512
Cantilever movement speed: 10 (μm/s)
Maximum indentation load: 10 (nN)

Next, the obtained DMT Modulus channel data was analyzed with the analysis software "NanoScopeAnalysis V1.40", and the number averages were calculated for each of five samples in which the value of Image Raw Mean of the Results tab and the value of Image Rq obtained by processing with Roughness were arbitrarily collected, and defined as "surface elastic modulus" and "root mean square (Rq) of elastic modulus". The measurement was performed on both surfaces (surface I/surface II) of the film, with N=3, respectively, and the average values thereof were adopted as the values of each surface.

(10) Stress at 10% Extension in Film MD Direction at 150° C.

A sample was prepared by cutting a film at an arbitrary position into a rectangle of 150 mm in length×10 mm in width in the MD direction. Using a tensile tester (Tensilon UCT-100 manufactured by Orientec Co., Ltd.), a tensile test was performed in the MD direction of the film at an initial tensile chuck distance of 50 mm and a tensile speed of 300 mm/min. For the measurement, the film sample was set in a thermostat set at 150° C. in advance, and the tensile test was performed after preheating for 90 seconds. A load applied to the film when the sample was extended by 10% (when the chuck distance became 55 mm) was read, and the value obtained by dividing the load by the cross-sectional area (film thickness×10 mm) of the sample before the test was defined as the stress at 10% extension. The measurement is performed defining the main orientation axis direction at an arbitrary position on the film as the TD direction and the direction orthogonal to the TD direction as the MD direction. Sampling was performed at five points at arbitrary positions, and an average value of values obtained by performing the measurement on each sample was adopted.

(11) Thickness Unevenness of Release Layer

According to the method described in (3), 10 cross-sectional photographs of the film were taken while changing the position in each of the MD direction and the TD direction, the maximum value and the minimum value of the release layer thickness were calculated from the obtained cross-sectional photographs in each direction and each position.

(12) Surface Tear Elongation at 180° C.

A sample was prepared by cutting a film into a rectangle of 150 mm in length×30 mm in width in the MD direction and TD direction, respectively. Using a tensile tester (Tensilon UCT-100 manufactured by Orientec Co., Ltd.), samples are created by elongation at elongation of 5%, 10%, 15%, 20%, 25% and 30%, respectively, in the longitudinal direction of the film sample, at an initial tensile chuck distance of 50 mm and a tensile speed of 300 mm/min. Thereafter, the surface of the obtained elongation sample is observed with an SEM to confirm the presence or absence of surface layer tear. After re-creating a sample in which the elongation was increased by 1% from the highest elongation condition among samples in which tear was observed, the presence or absence of tear was confirmed in the same manner, and the maximum elongation at which the tear occurred was adopted as the surface tear elongation of the sample at 180° C. In addition, when no tear occurred at 30% elongation, it was described as exceeding 30%.

(13) Piercing Strength

A sample was prepared by cutting a film into a square of 50 mm in length×50 mm in width in the longitudinal direction and the width direction. A piercing test was performed using a 0.5 mmφ needle at a crosshead speed of 5 mm/min using a tensile tester (Tensilon UCT-100 manufactured by Orientec Co., Ltd.), and piercing load and piercing displacement were measured. The measurement was performed five times each, and the average of the maximum piercing loads was adopted as the piercing strength of the sample. The measurement was performed after controlling room temperature at 25° C. and 63% Rh. The obtained piercing strength was evaluated according to the following criteria.

S: The piercing strength is 4 N or more and 7 N or less, the average forming depth is 4.5 mm or more, and a corner on the mold bottom side of the center position of a mold concave portion is sharply formed.

A: The average forming depth is 4.5 mm or more, and a corner on the mold bottom side is rounded but formed.

B: The average forming depth is 4.5 mm or more, but there are whitened portions.

C: The average forming depth is less than 4.5 mm.

B or more was judged as a pass.

(14) Followability to Mold Shape

The evaluation was performed using a 150 mm square concave mold with a depth of 5 mm. A release film cut into A4 size was vacuum-sucked into a mold and allowed to follow the mold. Thereafter, the vacuum was released, the depth at the corner position of the release film taken out was measured, and the average value of the four corners was defined as the forming depth. From the obtained average forming depth and reproducibility of the mold shape, followability to the mold was evaluated as follows.
S: The average forming depth is 4.5 mm or more, and a corner on the mold bottom side of the center position of a mold concave portion is sharply formed.
A: The average forming depth is 4.5 mm or more, and a corner on the mold bottom side is rounded but formed.
B: The average forming depth is 4.5 mm or more, but there are whitened portions.
C: The average forming depth is less than 4.5 mm.
B or more was judged as a pass.

(15) Releasability

A sealing material (Nagase ChemteX Corporation: trade name "R4212-2C") is placed on a 6-inch dummy wafer and disposed on a lower mold of the compression mold molding. A release film was vacuum-sucked and fixed on a concave upper mold and then molded to obtain a sealing test sample. The mold temperature was set to 130° C., the resin pressure was set to 3 MPa, and the curing time was set to 15 minutes. Releasability between the sealing material and the release film of the obtained sealing test sample was measured at a peel angle of 180° and a peel force at a peel speed of 300 mm/min, and evaluated based on the following criteria.
S: Less than 0.3 N/50 mm
A: 0.3 N/50 mm or more and less than 3.0 N/50 mm
B: 3.0 N/50 mm or more and less than 5.0 N/50 mm
C: 5.0 N/50 mm or more
B or more was judged as a pass.

(16) Molding Appearance 1

With respect to the sealing test sample obtained by the method described in (15), the surface of the sealing material after peeling the release film was visually observed and observed with a microscope (100 times), and evaluated based on the following criteria.
S: No wrinkles are observed by visual and microscopic observation.
A: No wrinkles are visually observed, and wrinkles are observed during microscopic observation.
B: Wrinkles are observed on a part of the surface of the sealing material by both visual and microscopic observation.
C: Wrinkles are observed on the entire surface of the sealing material by both visual and microscopic observation.
B or more was judged as a pass.

(17) Molding Appearance 2

A dummy epoxy board was set on a lower mold, a release film was vacuum-sucked and fixed on an upper mold, then the mold was clamped, and a sealing material (HC-300B, manufactured by Nitto Denko Corporation) was transfer-molded under conditions of a mold temperature of 180° C., an injection pressure of 7.7 MPa, and a curing time of 5 minutes. With respect to the obtained sealing test sample, the surface of the sealing material after peeling the release film and the release film were visually observed and observed with a microscope (100 times), and judged based on the following criteria.
S: No wrinkles are observed by visual and microscopic observation.
A: No wrinkles are visually observed, and wrinkles are observed during microscopic observation.
B: Wrinkles are observed on a part of the surface of the sealing material by both visual and microscopic observation. Alternatively, whitening is observed in the release film.
C: Wrinkles are observed on the entire surface of the sealing material by both visual and microscopic observation. Alternatively, the release film cannot be peeled.
B or more was judged as a pass.

(18) Perforability

Using a hot-needle perforation machine, a release film cut into A4 size was perforated under conditions of a hole diameter of 0.8 mm and a hole interval of 5 mm×5 mm (MD×TD). The state of perforation in the obtained release film was observed with a microscope (100 times), and judged based on the following criteria.
A: The number of places where no holes are formed on A4 size is less than 2.
B: There are 3 or more and less than 10 places where no holes are formed on A4 size.
C: There are 10 or more places where no holes are formed on the A4 size, or the film is torn.
B or more was judged as a pass.

Production of Polyester

Polyester resins used for film formation were prepared as follows.

Polyester A

A polyethylene terephthalate resin (intrinsic viscosity 0.65) of which a terephthalic component is 100 mol % as a dicarboxylic acid component and an ethylene glycol component is 100 mol % as a glycol component.

Polyester B

A copolymerized polyester (GN001 made by Eastman Chemical Company) in which 1,4-cyclohexane dimethanol was copolymerized with a glycol component, in an amount of 33 mol %, was used as a cyclohexane dimethanol copolymerized polyethylene terephthalate (intrinsic viscosity 0.75).

Polyester C

An isophthalic acid copolymerized polyethylene terephthalate resin (intrinsic viscosity 0.7) of which a terephthalic component is 82.5 mol % and an isophthalic component is 17.5 mol % as dicarboxylic acid components, and an ethylene glycol component is 100 mol % as a glycol component.

Polyester D

Polyethylene terephthalate copolymerized with 30% of ethoxylated bisphenol A diacrylate.

Polyester E

Polyethylene terephthalate copolymerized with 20 mol % of naphthalenedicarboxylic acid.

Polyester F

Polyethylene terephthalate copolymerized with 20 mol % of spiroglycol.

Polyester G

Polyethylene terephthalate copolymerized with 30% of cyclohexanedicarboxylic acid.

Polyetherimide

Polyetherimide-containing polyethylene terephthalate obtained by compounding 50 parts by mass of polyester A and 50 parts by mass of PEI "Ultem1010" manufactured by SABIC Innovative Plastics.

Particle Master

A polyethylene terephthalate particle master (intrinsic viscosity 0.65) containing in the polyester A aggregate silica particles of 2.2 μm in number average particle diameter in an amount of 2% by mass in terms of particle concentration.

Solution for Forming Release Layer 1

20 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 1 part by mass of an acrylic resin "Aron A-1017" manufactured by Toagosei Co., Ltd.: 8 parts by mass of toluene: 8 parts by mass of methyl ethyl ketone Solution for Forming Release Layer 2

20 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 15 parts by mass of an acrylic resin "Aron A-1017" manufactured by Toagosei Co., Ltd.: 8 parts by mass of toluene: 8 parts by mass of methyl ethyl ketone Solution for Forming Release Layer 3

10 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 15 parts by mass of an acrylic resin "Aron A-1017" manufactured by Toagosei Co., Ltd.: 8 parts by mass of toluene: 8 parts by mass of methyl ethyl ketone Solution for Forming Release Layer 4

5 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 15 parts by mass of an acrylic resin "Aron A-1017" manufactured by Toagosei Co., Ltd.: 8 parts by mass of toluene: 8 parts by mass of methyl ethyl ketone Solution for Forming Release Layer 5

1 Part by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 15 parts by mass of an acrylic resin "Aron A-1017" manufactured by Toagosei Co., Ltd.: 8 parts by mass of toluene: 8 parts by mass of methyl ethyl ketone Solution for Forming Release Layer 6

20 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 5 parts by mass of an acrylic resin "Aron A-1017" manufactured by Toagosei Co., Ltd.: 20 parts by mass of a long-chain alkyl chain-containing compound "trade name: Peeloil 1010S" manufactured by Ipposha Oil Industries Co., Ltd.: 8 parts by mass of toluene: 8 parts by mass of methyl ethyl ketone Solution for Forming Release Layer 7

20 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 5 parts by mass of an acrylic resin "Aron A-1017" manufactured by Toagosei Co., Ltd.: 10 parts by mass of a long-chain alkyl chain-containing compound "trade name: Peeloil 1010S" manufactured by Ipposha Oil Industries Co., Ltd.: 8 parts by mass of toluene: 8 parts by mass of methyl ethyl ketone Solution for Forming Release Layer 8

20 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 5 parts by mass of a polyester resin "VYLON UR-1350" manufactured by TOYOBO CO., LTD.: 10 parts by mass of a long-chain alkyl chain-containing compound "trade name: Peeloil 1010S" manufactured by Ipposha Oil Industries Co., Ltd.: 8 parts by mass of toluene: 8 parts by mass of methyl ethyl ketone Solution for Forming Release Layer 9

20 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 10 parts by mass of a polyester resin "VYLON UR-1350" manufactured by TOYOBO CO., LTD.: 10 parts by mass of a long-chain alkyl chain-containing compound "trade name: Peeloil 1010S" manufactured by Ipposha Oil Industries Co., Ltd.: 8 parts by mass of toluene: 8 parts by mass of methyl ethyl ketone Solution for Forming Release Layer 10

30 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 15 parts by mass of an acrylic resin "Aron A-1017" manufactured by Toagosei Co., Ltd.: 8 parts by mass of toluene: 8 parts by mass of methyl ethyl ketone Solution for Forming Release Layer 11

40 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 15 parts by mass of an acrylic resin "Aron A-1017" manufactured by Toagosei Co., Ltd.: 8 parts by mass of toluene: 8 parts by mass of methyl ethyl ketone Solution for Forming Release Layer 12

50 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 15 parts by mass of an acrylic resin "Aron A-1017" manufactured by Toagosei Co., Ltd.: 8 parts by mass of toluene: 8 parts by mass of methyl ethyl ketone Solution for Forming Release Layer 13

20 Parts by mass of methylated melamine formaldehyde "trade name: NIKALAC MX-706" manufactured by SANWA Chemical Co., Ltd: 0.4 parts by mass of amine p-toluenesulfonate manufactured by Mitsuwa Chemical Lab. Co., Ltd.: 8 parts by mass of toluene: 8 parts by mass of methyl ethyl ketone Solution for Forming Release Layer 14

50 parts by mass of an acrylic resin "trade name: SMP-250AP" manufactured by Kyoeisha Chemical Co., Ltd.: 40 parts by mass of "trade name: Resem N-137" manufactured by Chukyo Yushi Co., Ltd.: 3.0 parts by mass of "trade name "IRGACURE" (registered trademark) 184" manufactured by BASF Japan Ltd.: 20 parts by mass of ethylene glycol monobutyl ether Example 1

With compositions as shown in the tables, raw materials were supplied to separate vented same direction twin screw extruders each having an oxygen concentration of 0.2% by volume, melted at an A layer extruder cylinder temperature of 270° C. and a B layer extruder cylinder temperature of 277° C., and the molten mixture was discharged from a T die in the form of a sheet onto a cooling drum whose temperature was controlled at 25° C., at a short tube temperature after merging the A layer and the B layer of 277° C. and a cap temperature of 280° C. At that time, static electricity was applied using a wire-shaped electrode with a diameter of 0.1 mm, and the molten mixture was brought into close contact with the cooling drum to obtain an unstretched sheet. Subsequently, before stretching in the longitudinal direction, the film temperature was increased with a heating roll, and the film stretched 3.1 times in the longitudinal direction at a stretching temperature of 85° C., and immediately cooled with a metal roll whose temperature was controlled to 40° C.

Next, the film was stretched 3.5 times in the width direction at a preheating temperature of 100° C. and a stretching temperature of 120° C. with a tenter type lateral stretching machine, and then subjected to a heat treatment at a constant length in the tenter at a temperature of 240° C. for 15 seconds. Thereafter, a 3% relaxation treatment was performed, followed by a 2% relaxation treatment at a temperature of 200° C. to obtain a base film with a film thickness of 50 μm.

Then, after applying the solution to form release layer 1 to the base film by a gravure coating method, the film was transported to an oven, and the solution dried at a temperature of 100° C., a transport tension of 0.6 MPa and a draw setting of 0.40% of the first half of drying (process A), and at a temperature of 110° C., a transport tension of 0.6 MPa and a draw setting of 0.40% of the latter half of drying (process B), to obtain a release film with a release layer thickness of 135 nm. Table 2 shows the evaluation results of each characteristic.

Examples 2 to 46, Comparative Examples 1 to 5

A release film with a film thickness of 50 μm was obtained in the same manner as in Example 1, except that the film structure, the formulation of the release layer and the drying conditions were changed as shown in Tables 1, 3, 5, 7, 9 and 11. Tables 2, 4, 6, 8, 10 and 12 show the evaluation results of each characteristic.

Example 47

With compositions as shown in the tables, raw materials were supplied to separate vented same direction twin screw extruders each having an oxygen concentration of 0.2% by volume, and kneaded at an A layer extruder cylinder temperature of 270° C. and a B layer extruder cylinder temperature of 277° C. Subsequently, after passing through five FSS-type leaf disk filters, the mixtures were joined in a feed block having 387 slits while being weighed in a gear pump to form a laminate in which 387 layers were alternately laminated in the thickness direction of a lamination ratio of 4.0 (B layer/A layer). The slit lengths and intervals were all constant. The obtained laminate had 194 layers of polyester A and 193 layers of polyester B, and were alternately laminated in the thickness direction. The laminate was supplied to a T-die, formed into a sheet, and then quenched and solidified on a casting drum kept at a surface temperature of 25° C. while applying an electrostatic application voltage of 8 kV with a wire to obtain an unstretched cast film. Thereafter, a release film with a film thickness of 50 μm was obtained in the same manner as in Example 1. Table 16 shows the evaluation results of each characteristic.

TABLE 1

|  |  | Example 1 | Example 2 | Example 3 |
|---|---|---|---|---|
| Film structure | B layer | Polyester A (70 wt %) Polyester B (30 wt %) | Polyester A (70 wt %) Polyester B (30 wt %) | Polyester A (70 wt %) Polyester B (30 wt %) |
|  | A layer | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
| Layer structure (thickness (μm) of each layer) | | A/B/A(5/45/5) | A/B/A(5/45/5) | A/B/A(5/45/5) |
| Film forming conditions | Heat treatment temperature (° C.) | 240 | 240 | 240 |
|  | Heat treatment time (sec) | 15 | 15 | 15 |
| Release layer | Release layer | 1 | 1 | 1 |
|  | Process A Drying temperature (° C.) | 100 | 100 | 100 |
|  | Transport tension (MPa) | 0.6 | 1.3 | 2 |
|  | Draw setting (%) | 0.40 | 0.40 | 0.40 |
|  | Process B Drying temperature (° C.) | 110 | 110 | 110 |
|  | Transport tension (MPa) | 0.6 | 1.3 | 2 |
|  | Draw setting (%) | 0.40 | 0.40 | 0.40 |
|  | Thickness (nm) | 135 | 135 | 135 |
|  | Thickness unevenness (nm) | 72 | 76 | 77 |

|  |  | Example 4 | Example 5 | Example 6 |
|---|---|---|---|---|
| Film structure | B layer | Polyester A (70 wt %) Polyester B (30 wt %) | Polyester A (70 wt %) Polyester B (30 wt %) | Polyester A (70 wt %) Polyester B (30 wt %) |
|  | A layer | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
| Layer structure (thickness (μm) of each layer) | | A/B/A(5/45/5) | A/B/A(5/45/5) | A/B/A(5/45/5) |
| Film forming conditions | Heat treatment temperature (° C.) | 240 | 240 | 240 |
|  | Heat treatment time (sec) | 15 | 15 | 15 |
| Release layer | Release layer | 1 | 1 | 1 |
|  | Process A Drying temperature (° C.) | 100 | 100 | 100 |
|  | Transport tension (MPa) | 2.9 | 3.8 | 4.8 |
|  | Draw setting (%) | 0.40 | 0.40 | 0.40 |
|  | Process B Drying temperature (° C.) | 110 | 110 | 110 |
|  | Transport tension (MPa) | 2.9 | 3.8 | 4.8 |
|  | Draw setting (%) | 0.40 | 0.40 | 0.40 |
|  | Thickness (nm) | 135 | 135 | 135 |
|  | Thickness unevenness (nm) | 75 | 73 | 72 |

TABLE 2

|  |  | Example 1 | Example 2 | Example 3 |
|---|---|---|---|---|
| Film properties | Stress at 10% Extension in Base Film MD Direction at 150° C. (Mpa) | 28.4 | 28.6 | 28.3 |
|  | Melting point Tm (° C.) | 248 | 248 | 248 |
|  | Melting point of surface layers (surface I/surface II) Tms (° C.) | 253/253 | 253/253 | 253/253 |
|  | S1(%) | 1.5 | 0.9 | 0.5 |
|  | T1 (° C.) | 80 | 80 | 80 |
|  | S0(%) | 0.03 | 0.03 | 0.03 |
|  | \|S1 − S0\|/(T1 − 40) | 0.037 | 0.022 | 0.012 |
|  | Sa (mN/m) (surface I/surface II) | 21.4/47.1 | 21.9/47.8 | 21.6/47.3 |
|  | Sb (mN/m) (surface I/surface II) | 31.2/47.1 | 31.1/47.8 | 30.9/47.3 |
|  | Sc (mN/m) (surface I/surface II) | 32.1/47.2 | 31.5/48.0 | 31.3/47.5 |
|  | \|Sa − Sb\| (surface I/surface II) | 9.6/0 | 9.2/0 | 9.3/0 |
|  | \|Sa − Sc\| (surface I/surface II) | 10.7/0.1 | 9.6/0.2 | 9.7/0.2 |
|  | Surface elastic modulus (MPa) (surface I/surface II) | 1885/3013 | 1880/3025 | 1888/3031 |
|  | Root mean square Rq of surface elastic modulus (Mpa) (surface I/surface II) | 351/612 | 360/609 | 387/610 |
|  | Polar force (mN/m) (surface I/surface II) | 1.8/11.0 | 1.7/11.0 | 1.7/11.0 |
|  | Surface tear elongation (%) at 180° C. | Exceeding 30% | Exceeding 30% | Exceeding 30% |
|  | Piercing strength (N) | 12.2 | 12.0 | 11.7 |
| Evaluation | Followability to mold shape | A | A | A |
|  | Releasability | S | S | S |
|  | Molding appearance 1 | B | A | S |
|  | Molding appearance 2 | C | C | C |
|  | Perforability | C | C | C |

|  |  | Example 4 | Example 5 | Example 6 |
|---|---|---|---|---|
| Film properties | Stress at 10% Extension in Base Film MD Direction at 150° C. (Mpa) | 28.8 | 28.8 | 28.6 |
|  | Melting point Tm (° C.) | 248 | 248 | 248 |
|  | Melting point of surface layers (surface I/surface II) Tms (° C.) | 253/253 | 253/253 | 253/253 |
|  | S1(%) | 0.3 | 0.2 | 0.15 |
|  | T1 (° C.) | 80 | 60 | 45 |
|  | S0(%) | 0.03 | 0.03 | 0.02 |
|  | \|S1 − S0\|/(T1 − 40) | 0.007 | 0.009 | 0.026 |
|  | Sa (mN/m) (surface I/surface II) | 20.9/47.3 | 21.2/47.5 | 21.3/47.1 |
|  | Sb (mN/m) (surface I/surface II) | 30.8/47.3 | 31.2/47.5 | 31.1/47.1 |
|  | Sc (mN/m) (surface I/surface II) | 31.8/47.5 | 30.9/47.7 | 32.1/47.3 |
|  | \|Sa − Sb\| (surface I/surface II) | 9.9/0 | 10.0/0 | 9.8/0 |
|  | \|Sa − Sc\| (surface I/surface II) | 10.9/0.2 | 9.7/0.2 | 10.8/0.2 |
|  | Surface elastic modulus (MPa) (surface I/surface II) | 1984/3022 | 1924/3041 | 1857/3045 |
|  | Root mean square Rq of surface elastic modulus (Mpa) (surface I/surface II) | 387/620 | 395/631 | 381/588 |
|  | Polar force (mN/m) (surface I/surface II) | 1.8/11.0 | 1.8/11.0 | 1.7/11.0 |
|  | Surface tear elongation (%) at 180° C. | Exceeding 30% | Exceeding 30% | Exceeding 30% |
|  | Piercing strength (N) | 11.5 | 11.6 | 12.0 |
| Evaluation | Followability to mold shape | A | B | B |
|  | Releasability | S | S | S |
|  | Molding appearance 1 | S | A | B |
|  | Molding appearance 2 | C | C | C |
|  | Perforability | C | C | C |

TABLE 3

|  |  |  | Example 7 | Example 8 | Example 9 |
|---|---|---|---|---|---|
| Film structure |  | B layer | Polyester A (70 wt %) Polyester B (30 wt %) | Polyester A (70 wt %) Polyester B (30 wt %) | Polyester A (70 wt %) Polyester B (30 wt %) |
|  |  | A layer | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
|  | Layer structure (thickness (μm) of each layer) |  | A/B/A(5/45/5) | A/B/A(5/45/5) | A/B/A(5/45/5) |
| Film forming conditions | Heat treatment temperature (° C.) |  | 240 | 240 | 240 |
|  | Heat treatment time (sec) |  | 15 | 15 | 15 |
| Release layer |  | Release layer | 3 | 4 | 5 |
|  | Process | Drying temperature (° C.) | 100 | 100 | 100 |

TABLE 3-continued

|  |  |  |  |  |  |
|---|---|---|---|---|---|
|  | A | Transport tension (MPa) | 0.6 | 0.6 | 0.6 |
|  |  | Draw setting (%) | 0.40 | 0.40 | 0.40 |
|  | Process | Drying temperature (° C.) | 110 | 110 | 110 |
|  | B | Transport tension (MPa) | 0.6 | 0.6 | 0.6 |
|  |  | Draw setting (%) | 0.40 | 0.40 | 0.40 |
|  |  | Thickness (nm) | 135 | 135 | 135 |
|  |  | Thickness unevenness (nm) | 76 | 75 | 73 |

|  |  | Example 10 | Example 11 | Example 12 |
|---|---|---|---|---|
| Film structure | B layer | Polyester A (70 wt %) Polyester B (30 wt %) | Polyester A (70 wt %) Polyester B (30 wt %) | Polyester A (70 wt %) Polyester B (30 wt %) |
|  | A layer | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
| Layer structure (thickness (μm) of each layer) |  | A/B/A(5/45/5) | A/B/A(5/45/5) | A/B/A(5/45/5) |
| Film forming conditions | Heat treatment temperature (° C.) | 240 | 240 | 240 |
|  | Heat treatment time (sec) | 15 | 15 | 15 |
| Release layer | Release layer | 1 | 1 | 6 |
|  | Process A | Drying temperature (° C.) | 100 | 100 | 100 |
|  |  | Transport tension (MPa) | 0.6 | 0.6 | 2 |
|  |  | Draw setting (%) | 0.10 | 0.00 | 0.40 |
|  | Process B | Drying temperature (° C.) | 110 | 110 | 110 |
|  |  | Transport tension (MPa) | 0.6 | 0.6 | 2 |
|  |  | Draw setting (%) | 0.10 | 0.00 | 0.40 |
|  |  | Thickness (nm) | 135 | 135 | 135 |
|  |  | Thickness unevenness (nm) | 92 | 103 | 77 |

TABLE 4

|  |  | Example 7 | Example 8 | Example 9 |
|---|---|---|---|---|
| Film properties | Stress at 10% Extension in Base Film MD Direction at 150° C. (Mpa) | 28.4 | 28.4 | 28.4 |
|  | Melting point Tm (° C.) | 248 | 248 | 248 |
|  | Melting point of surface layers (surface I/surface II) Tms (° C.) | 253/253 | 253/253 | 253/253 |
|  | S1(%) | 1.5 | 1.43 | 1.45 |
|  | T1 (° C.) | 80 | 80 | 80 |
|  | S0(%) | 0.03 | 0.03 | 0.03 |
|  | \|S1 − S0\|/(T1 − 40) | 0.037 | 0.035 | 0.036 |
|  | Sa (mN/m) (surface I/surface II) | 21.7/47.2 | 22.0/47.1 | 21.8/47.6 |
|  | Sb (mN/m) (surface I/surface II) | 30.4/47.2 | 30.5/47.1 | 30.2/47.6 |
|  | Sc (mN/m) (surface I/surface II) | 31.0/47.4 | 31.1/47.4 | 32.0/47.8 |
|  | \|Sa − Sb\| (surface I/surface II) | 8.7/0 | 8.5/0 | 8.4/0 |
|  | \|Sa − Sc\| (surface I/surface II) | 9.3/0.2 | 9.1/0.3 | 10.8/0.2 |
|  | Surface elastic modulus (MPa) (surface I/surface II) | 730/3039 | 432/2998 | 81/3124 |
|  | Root mean square Rq of surface elastic modulus (Mpa) (surface I/surface II) | 256/599 | 208/631 | 138/584 |
|  | Polar force (mN/m) (surface I/surface II) | 0.9/11.0 | 0.9/11.0 | 1.0/11.0 |
|  | Surface tear elongation (%) at 180° C. | Exceeding 30% | Exceeding 30% | Exceeding 30% |
|  | Piercing strength (N) | 12.8 | 12.5 | 12.1 |
| Evaluation | Followability to mold shape | A | A | A |
|  | Releasability | S | A | B |
|  | Molding appearance 1 | B | B | B |
|  | Molding appearance 2 | C | C | C |
|  | Perforability | C | C | C |

|  |  | Example 10 | Example 11 | Example 12 |
|---|---|---|---|---|
| Film properties | Stress at 10% Extension in Base Film MD Direction at 150° C. (Mpa) | 28.4 | 28.4 | 28.5 |
|  | Melting point Tm (° C.) | 248 | 248 | 248 |
|  | Melting point of surface layers (surface I/surface II) Tms (° C.) | 253/253 | 253/253 | 253/253 |
|  | S1(%) | 1.5 | 1.5 | 0.4 |
|  | T1 (° C.) | 80 | 80 | 80 |
|  | S0(%) | 0.03 | 0.03 | 0.03 |
|  | \|S1 − S0\|/(T1 − 40) | 0.037 | 0.037 | 0.009 |
|  | Sa (mN/m) (surface I/surface II) | 21.4/47.1 | 21.0/47.4 | 21.1/47.8 |
|  | Sb (mN/m) (surface I/surface II) | 29.9/47.1 | 30.2/47.4 | 31.1/47.8 |
|  | Sc (mN/m) (surface I/surface II) | 31.7/47.3 | 31.9/47.6 | 31.8/47.9 |
|  | \|Sa − Sb\| (surface I/surface II) | 8.5/0 | 9.2/0 | 10.0/0 |
|  | \|Sa − Sc\| (surface I/surface II) | 10.3/0.2 | 10.9/0.2 | 10.7/0.1 |

TABLE 4-continued

|  |  |  |  |  |
|---|---|---|---|---|
| | Surface elastic modulus (MPa) (surface I/surface II) | 1980/3036 | 1980/3028 | 231/3015 |
| | Root mean square Rq of surface elastic modulus (Mpa) (surface I/surface II) | 498/594 | 521/600 | 372/604 |
| | Polar force (mN/m) (surface I/surface II) | 1.5/11.0 | 1.5/11.0 | 0.5/11.0 |
| | Surface tear elongation (%) at 180° C. | Exceeding 30% | Exceeding 30% | Exceeding 30% |
| | Piercing strength (N) | 12.2 | 12.7 | 12.4 |
| Evaluation | Followability to mold shape | A | A | A |
| | Releasability | A | B | S |
| | Molding appearance 1 | B | B | B |
| | Molding appearance 2 | C | C | C |
| | Perforability | C | C | C |

TABLE 5

|  |  |  | Example 13 | Example 14 | Example 15 |
|---|---|---|---|---|---|
| Film structure | B layer | | Polyester A (70 wt %) Polyester B (30 wt %) | Polyester A (70 wt %) Polyester B (30 wt %) | Polyester A (70 wt %) Polyester B (30 wt %) |
| | A layer | | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
| Layer structure (thickness (μm) of each layer) | | | A/B/A(5/45/5) | A/B/A(5/45/5) | A/B/A(5/45/5) |
| Film forming conditions | Heat treatment temperature (° C.) | | 240 | 240 | 240 |
| | Heat treatment time (sec) | | 15 | 15 | 15 |
| Release layer | Release layer | | 7 | 8 | 9 |
| | Process A | Drying temperature (° C.) | 100 | 100 | 100 |
| | | Transport tension (MPa) | 2 | 2 | 2 |
| | | Draw setting (%) | 0.40 | 0.40 | 0.40 |
| | Process B | Drying temperature (° C.) | 110 | 110 | 110 |
| | | Transport tension (MPa) | 2 | 2 | 2 |
| | | Draw setting (%) | 0.40 | 0.40 | 0.40 |
| | | Thickness (nm) | 135 | 135 | 135 |
| | | Thickness unevenness (nm) | 72 | 77 | 74 |

|  |  |  | Example 16 | Example 17 | Example 18 |
|---|---|---|---|---|---|
| Film structure | B layer | | Polyester A (70 wt %) Polyester B (30 wt %) | Polyester A (70 wt %) Polyester B (30 wt %) | Polyester A (70 wt %) Polyester B (30 wt %) |
| | A layer | | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
| Layer structure (thickness (μm) of each layer) | | | A/B/A(5/45/5) | A/B/A(5/45/5) | A/B/A(5/45/5) |
| Film forming conditions | Heat treatment temperature (° C.) | | 240 | 240 | 240 |
| | Heat treatment time (sec) | | 15 | 15 | 15 |
| Release layer | Release layer | | 1 | 1 | 1 |
| | Process A | Drying temperature (° C.) | 100 | 100 | 100 |
| | | Transport tension (MPa) | 0.6 | 0.6 | 0.6 |
| | | Draw setting (%) | 0.40 | 0.40 | 0.40 |
| | Process B | Drying temperature (° C.) | 110 | 110 | 110 |
| | | Transport tension (MPa) | 0.6 | 0.6 | 0.6 |
| | | Draw setting (%) | 0.40 | 0.40 | 0.40 |
| | | Thickness (nm) | 480 | 370 | 280 |
| | | Thickness unevenness (nm) | 121 | 108 | 89 |

TABLE 6

|  |  | Example 13 | Example 14 | Example 15 |
|---|---|---|---|---|
| Film properties | Stress at 10% Extension in Base Film MD Direction at 150° C. (Mpa) | 28.5 | 28.5 | 28.5 |
| | Melting point Tm (° C.) | 248 | 248 | 248 |
| | Melting point of surface layers (surface I/surface II) Tms (° C.) | 253/253 | 253/253 | 253/253 |
| | S1(%) | 0.5 | 0.5 | 0.5 |
| | T1 (° C.) | 80 | 80 | 80 |
| | S0(%) | 0.03 | 0.03 | 0.03 |
| | \|S1 − S0\|/(T1 − 40) | 0.012 | 0.012 | 0.012 |
| | Sa (mN/m) (surface I/surface II) | 21.8/47.7 | 21.0/47.2 | 21.6/47.5 |
| | Sb (mN/m) (surface I/surface II) | 30.8/47.7 | 30.5/47.2 | 30.6/47.5 |
| | Sc (mN/m) (surface I/surface II) | 30.9/47.9 | 31.0/47.3 | 31.1/47.5 |

TABLE 6-continued

|  |  | | | |
|---|---|---|---|---|
| | \|Sa − Sb\| (surface I/surface II) | 9.0/0 | 9.5/0 | 9.0/0 |
| | \|Sa − Sc\| (surface I/surface II) | 9.1/0.2 | 10.0/0.1 | 9.5/0 |
| | Surface elastic modulus (MPa) (surface I/surface II) | 1587/3076 | 2122/3015 | 2319/3015 |
| | Root mean square Rq of surface elastic modulus (Mpa) (surface I/surface II) | 289/573 | 412/599 | 464/602 |
| | Polar force (mN/m) (surface I/surface II) | 0.3/11.0 | 3.2/11.0 | 4.1/11.0 |
| | Surface tear elongation (%) at 180° C. | Exceeding 30% | Exceeding 30% | Exceeding 30% |
| | Piercing strength (N) | 12.3 | 12.6 | 12.9 |
| Evaluation | Followability to mold shape | A | A | A |
| | Releasability | S | A | B |
| | Molding appearance 1 | A | S | S |
| | Molding appearance 2 | C | C | C |
| | Perforability | C | C | C |

| | | Example 16 | Example 17 | Example 18 |
|---|---|---|---|---|
| Film properties | Stress at 10% Extension in Base Film MD Direction at 150° C. (Mpa) | 28.4 | 28.4 | 28.4 |
| | Melting point Tm (° C.) | 248 | 248 | 248 |
| | Melting point of surface layers (surface I/surface II) Tms (° C.) | 253/253 | 253/253 | 253/253 |
| | S1(%) | 1.5 | 1.5 | 1.5 |
| | T1 (° C.) | 80 | 80 | 80 |
| | S0(%) | 0.03 | 0.03 | 0.03 |
| | \|S1 − S0\|/(T1 − 40) | 0.037 | 0.037 | 0.037 |
| | Sa (mN/m) (surface I/surface II) | 21.4/47.3 | 21.5/47.6 | 21.4/47.6 |
| | Sb (mN/m) (surface I/surface II) | 36.3/47.3 | 34.3/47.6 | 32.2/47.6 |
| | Sc (mN/m) (surface I/surface II) | 36.2/47.5 | 34.0/47.8 | 31.4/47.8 |
| | \|Sa − Sb\| (surface I/surface II) | 14.9/0 | 12.8/0 | 10.8/0 |
| | \|Sa − Sc\| (surface I/surface II) | 14.8/0.2 | 12.5/0.2 | 10.0/0.2 |
| | Surface elastic modulus (MPa) (surface I/surface II) | 2010/3053 | 1999/3089 | 1985/3067 |
| | Root mean square Rq of surface elastic modulus (Mpa) (surface I/surface II) | 380/594 | 371/611 | 365/620 |
| | Polar force (mN/m) (surface I/surface II) | 1.7/11.0 | 1.6/11.0 | 1.6/11.0 |
| | Surface tear elongation (%) at 180° C. | Exceeding 30% | Exceeding 30% | Exceeding 30% |
| | Piercing strength (N) | 12.8 | 12.8 | 12.6 |
| Evaluation | Followability to mold shape | A | A | A |
| | Releasability | B | A | S |
| | Molding appearance 1 | B | B | B |
| | Molding appearance 2 | C | C | C |
| | Perforability | C | C | C |

TABLE 7

| | | | Example 19 | Example 20 | Example 21 | Example 22 |
|---|---|---|---|---|---|---|
| Film structure | B layer | | Polyester A (70 wt %) Polyester B (30 wt %) | Polyester A (70 wt %) Polyester B (30 wt %) | Polyester A (70 wt %) Polyester B (30 wt %) | Polyester A (60 wt %) Polyester C (40 wt %) |
| | A layer | | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) | Polyester A (89 wt %) Polyester C (10 wt %) Particle master (1 wt %) |
| Layer structure (thickness (μm) of each layer) | | | A/B/A(5/45/5) | A/B/A(5/45/5) | A/B/A(5/45/5) | A/B/A(5/45/5) |
| Film forming conditions | Heat treatment temperature (° C.) | | 240 | 240 | 240 | 220 |
| | Heat treatment time (sec) | | 15 | 15 | 15 | 15 |
| Release layer | Release layer | | 1 | 1 | 1 | 1 |
| | Process A | Drying temperature (° C.) | 100 | 100 | 100 | 100 |
| | | Transport tension (MPa) | 0.6 | 0.6 | 0.6 | 0.6 |

TABLE 7-continued

|  |  |  |  |  |  |  |
|---|---|---|---|---|---|---|
|  |  | Draw setting (%) | 0.40 | 0.40 | 0.40 | 0.40 |
|  | Process B | Drying temperature (° C.) | 110 | 110 | 110 | 110 |
|  |  | Transport tension (MPa) | 0.6 | 0.6 | 0.6 | 0.6 |
|  |  | Draw setting (%) | 0.40 | 0.40 | 0.40 | 0.40 |
|  | Thickness (nm) |  | 55 | 75 | 85 | 135 |
|  | Thickness unevenness (nm) |  | 53 | 58 | 61 | 77 |

|  |  |  | Example 23 | Example 24 | Example 25 |
|---|---|---|---|---|---|
| Film structure | B layer |  | Polyester A (60 wt %) Polyester C (40 wt %) | Polyester A (60 wt %) Polyester B (40 wt %) | Polyester A (60 wt %) Polyester B (40 wt %) |
|  | A layer |  | Polyester A (89 wt %) Polyester C (10 wt %) Particle master (1 wt %) | Polyester A (79 wt %) Polyester B (20 wt %) Particle master (1 wt %) | Polyester A (79 wt %) Polyester B (10 wt %) Particle master (1 wt %) |
| Layer structure (thickness (μm) of each layer) |  |  | A/B/A(5/45/5) | A/B/A(5/45/5) | A/B/A(5/45/5) |
| Film forming conditions | Heat treatment temperature (° C.) |  | 220 | 240 | 240 |
|  | Heat treatment time (sec) |  | 15 | 15 | 15 |
| Release layer | Release layer |  | 1 | 1 | 1 |
|  | Process A | Drying temperature (° C.) | 100 | 100 | 100 |
|  |  | Transport tension (MPa) | 0.6 | 0.6 | 0.6 |
|  |  | Draw setting (%) | 0.40 | 0.40 | 0.40 |
|  | Process B | Drying temperature (° C.) | 110 | 110 | 110 |
|  |  | Transport tension (MPa) | 0.6 | 0.6 | 0.6 |
|  |  | Draw setting (%) | 0.40 | 0.40 | 0.40 |
|  | Thickness (nm) |  | 135 | 135 | 135 |
|  | Thickness unevenness (nm) |  | 78 | 74 | 75 |

TABLE 8

|  |  | Example 19 | Example 20 | Example 21 | Example 22 |
|---|---|---|---|---|---|
| Film properties | Stress at 10% Extension in Base Film MD Direction at 150° C. (Mpa) | 28.4 | 28.4 | 28.4 | 19 |
|  | Melting point Tm (° C.) | 248 | 248 | 248 | 240 |
|  | Melting point of surface layers (surface I/surface II) Tms (° C.) | 253/253 | 253/253 | 253/253 | 253/253 |
|  | S1(%) | 1.5 | 1.5 | 1.5 | 1.3 |
|  | T1 (° C.) | 80 | 80 | 80 | 68 |
|  | S0(%) | 0.03 | 0.03 | 0.03 | 0.03 |
|  | \|S1 − S0\|/(T1 − 40) | 0.037 | 0.037 | 0.037 | 0.045 |
|  | Sa (mN/m) (surface I/surface II) | 21.3/47.5 | 21.5/47.4 | 21.3/47.5 | 22.0/47.4 |
|  | Sb (mN/m) (surface I/surface II) | 35.8/47.5 | 33.9/47.4 | 30.8/47.5 | 32.0/47.4 |
|  | Sc (mN/m) (surface I/surface II) | 35.9/47.8 | 34.1/47.5 | 31.3/47.8 | 32.1/47.6 |
|  | \|Sa − Sb\| (surface I/surface II) | 14.5/0 | 12.4/0 | 9.5/0 | 10.0/0 |
|  | \|Sa − Sc\| (surface I/surface II) | 14.6/0.3 | 12.6/0.1 | 10.0/0.3 | 10.1/0.2 |
|  | Surface elastic modulus (MPa) (surface I/surface II) | 1831/3042 | 1911/3055 | 1959/3037 | 1966/3056 |
|  | Root mean square Rq of surface elastic modulus (Mpa) (surface I/surface II) | 358/621 | 376/586 | 388/589 | 387/600 |

TABLE 8-continued

|  |  |  |  |  |  |
|---|---|---|---|---|---|
| | Polar force (mN/m) (surface I/surface II) | 1.6/11.0 | 1.6/11.0 | 1.7/11.0 | 1.6/11.0 |
| | Surface tear elongation (%) at 180° C. | Exceeding 30% | Exceeding 30% | Exceeding 30% | Exceeding 30% |
| | Piercing strength (N) | 12.5 | 12.4 | 12.1 | 18.7 |
| Evaluation | Followability to mold shape | A | A | A | A |
| | Releasability | B | A | A | S |
| | Molding appearance 1 | B | B | B | B |
| | Molding appearance 2 | C | C | C | C |
| | Perforability | C | C | C | C |

|  |  | Example 23 | Example 24 | Example 25 |
|---|---|---|---|---|
| Film properties | Stress at 10% Extension in Base Film MD Direction at 150° C. (Mpa) | 28.4 | 17.3 | 24.1 |
| | Melting point Tm (° C.) | 244 | 245 | 248 |
| | Melting point of surface layers (surface I/surface II) Tms (° C.) | 253/253 | 249/249 | 253/253 |
| | S1(%) | 1.2 | 0.7 | 0.9 |
| | T1 (° C.) | 73 | 80 | 80 |
| | S0(%) | 0.03 | 0.08 | 0.03 |
| | \|S1 − S0\|/(T1 − 40) | 0.035 | 0.016 | 0.022 |
| | Sa (mN/m) (surface I/surface II) | 21.7/47.7 | 21.5/47.6 | 21.5/47.5 |
| | Sb (mN/m) (surface I/surface II) | 30.9/47.7 | 31.1/47.6 | 32.1/47.5 |
| | Sc (mN/m) (surface I/surface II) | 31.5/47.7 | 31.8/47.9 | 32.3/47.7 |
| | \|Sa − Sb\| (surface I/surface II) | 9.2/0 | 9.6/0 | 10.6/0 |
| | \|Sa − Sc\| (surface I/surface II) | 9.8/0 | 10.3/0.2 | 10.8/0.2 |
| | Surface elastic modulus (MPa) (surface I/surface II) | 1985/3017 | 1879/3030 | 1919/3041 |
| | Root mean square Rq of surface elastic modulus (Mpa) (surface I/surface II) | 389/596 | 305/612 | 379/631 |
| | Polar force (mN/m) (surface I/surface II) | 1.6/11.0 | 1.7/11.0 | 1.6/11.0 |
| | Surface tear elongation (%) at 180° C. | Exceeding 30% | Exceeding 30% | Exceeding 30% |
| | Piercing strength (N) | 18.8 | 5.8 | 7.4 |
| Evaluation | Followability to mold shape | A | S | A |
| | Releasability | S | S | B |
| | Molding appearance 1 | B | A | A |
| | Molding appearance 2 | C | C | C |
| | Perforability | C | A | B |

TABLE 9

|  |  |  | Example 26 | Example 27 | Example 28 | Example 29 |
|---|---|---|---|---|---|---|
| Film structure | B layer | | Polyester A (60 wt %) Polyester B (40 wt %) | Polyester A (60 wt %) Polyester B (40 wt %) | Polyester A (60 wt %) Polyester B (40 wt %) | Polyester A (60 wt %) Polyester B (40 wt %) |
| | A layer | | Polyester A (79 wt %) Polyester B (10 wt %) Particle master (1 wt %) | Polyester A (79 wt %) Polyester B (20 wt %) Particle master (1 wt %) | Polyester A (79 wt %) Polyester B (20 wt %) Particle master (1 wt %) | Polyester A (79 wt %) Polyester B (20 wt %) Particle master (1 wt %) |
| Layer structure (thickness (μm) of each layer) | | | A/B/A(5/45/5) | A/B/A(5/45/5) | A/B/A(5/45/5) | A/B/A(5/45/5) |
| Film forming conditions | Heat treatment temperature (° C.) | | 240 | 240 | 240 | 240 |
| | Heat treatment time (sec) | | 15 | 15 | 15 | 15 |
| Release layer | Release layer | | 1 | 1 | 1 | 1 |
| | Process A | Drying temperature (° C.) | 100 | 100 | 100 | 100 |
| | | Transport tension (MPa) | 0.6 | 0.6 | 0.6 | 0.6 |
| | | Draw setting (%) | 0.40 | 3.50 | 4.30 | 5.50 |
| | Process B | Drying temperature (° C.) | 110 | 110 | 110 | 110 |
| | | Transport tension (MPa) | 0.6 | 0.6 | 0.6 | 0.6 |

TABLE 9-continued

|  |  | | | | |
|---|---|---|---|---|---|
|  | Draw setting (%) | 0.40 | 3.50 | 4.30 | 5.50 |
|  | Thickness (nm) | 135 | 135 | 135 | 135 |
|  | Thickness unevenness (nm) | 78 | 75 | 72 | 71 |

|  |  |  | Example 30 | Example 31 | Example 32 | Example 33 |
|---|---|---|---|---|---|---|
| Film structure | B layer | | Polyester A (60 wt %) Polyester B (40 wt %) | Polyester A (70 wt %) Polyester B (30 wt %) | Polyester A (70 wt %) Polyester B (30 wt %) | Polyester A (70 wt %) Polyester B (30 wt %) |
|  | A layer | | Polyester A (79 wt %) Polyester B (20 wt %) Particle master (1 wt %) | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
| Layer structure (thickness (μm) of each layer) | | | A/B/A(5/45/5) | A/B/A(5/45/5) | A/B/A(5/45/5) | A/B/A(5/45/5) |
| Film forming conditions | Heat treatment temperature (° C.) | | 240 | 240 | 240 | 240 |
|  | Heat treatment time (sec) | | 15 | 15 | 15 | 15 |
| Release layer | Release layer | | 1 | 10 | 11 | 12 |
|  | Process A | Drying temperature (° C.) | 100 | 100 | 100 | 100 |
|  |  | Transport tension (MPa) | 0.6 | 0.6 | 0.6 | 0.6 |
|  |  | Draw setting (%) | 7.00 | 0.40 | 0.40 | 0.40 |
|  | Process B | Drying temperature (° C.) | 110 | 110 | 110 | 110 |
|  |  | Transport tension (MPa) | 0.6 | 0.6 | 0.6 | 0.6 |
|  |  | Draw setting (%) | 0.00 | 0.40 | 0.40 | 0.40 |
|  | Thickness (nm) | | 135 | 135 | 135 | 135 |
|  | Thickness unevenness (nm) | | 78 | 76 | 74 | 73 |

TABLE 10

|  |  | Example 26 | Example 27 | Example 28 | Example 29 |
|---|---|---|---|---|---|
| Film properties | Stress at 10% Extension in Base Film MD Direction at 150° C. (Mpa) | 24.1 | 17.3 | 17.3 | 17.3 |
|  | Melting point Tm (° C.) | 248 | 245 | 245 | 245 |
|  | Melting point of surface layers (surface I/surface II) Tms (° C.) | 253/253 | 249/249 | 249/249 | 249/249 |
|  | S1(%) | 0.9 | 0.7 | 0.7 | 0.7 |
|  | T1 (° C.) | 80 | 80 | 80 | 80 |
|  | S0(%) | 0.03 | 0.08 | 0.08 | 0.08 |
|  | \|S1 − S0\|/(T1 − 40) | 0.022 | 0.016 | 0.016 | 0.016 |
|  | Sa (mN/m) (surface I/surface II) | 21.9/47.1 | 21.5/47.1 | 21.6/47.4 | 21.5/47.4 |
|  | Sb (mN/m) (surface I/surface II) | 30.5/47.1 | 30.9/47.4 | 30.8/47.4 | 30.9/47.4 |
|  | Sc (mN/m) (surface I/surface II) | 31.1/47.4 | 33.8/47.5 | 34.6/47.5 | 36.4/47.5 |
|  | \|Sa − Sb\| (surface I/surface II) | 9.6/0 | 9.4/0 | 9.2/0 | 9.4/0 |
|  | \|Sa − Sc\| (surface I/surface II) | 9.2/0.3 | 12.3/0.1 | 13.0/0.1 | 14.9/0.1 |
|  | Surface elastic modulus (MPa) (surface I/surface II) | 1919/3041 | 1980/3080 | 1990/3075 | 1995/3070 |
|  | Root mean square Rq of surface elastic modulus (Mpa) (surface I/surface II) | 379/631 | 320/609 | 291/608 | 200/607 |
|  | Polar force (mN/m) (surface I/surface II) | 1.6/11.0 | 1.7/11.0 | 1.6/11.0 | 1.8/11.0 |
|  | Surface tear elongation (%) at 180° C. | Exceeding 30% | Exceeding 30% | Exceeding 30% | Exceeding 30% |
|  | Piercing strength (N) | 7.5 | 5.3 | 5.5 | 6.2 |

TABLE 10-continued

|  |  | | | | |
|---|---|---|---|---|---|
| Evaluation | Followability to mold shape | A | S | A | B |
|  | Releasability | B | A | A | B |
|  | Molding appearance 1 | A | B | B | B |
|  | Molding appearance 2 | C | C | C | C |
|  | Perforability | B | A | A | A |

|  |  | Example 30 | Example 31 | Example 32 | Example 33 |
|---|---|---|---|---|---|
| Film properties | Stress at 10% Extension in Base Film MD Direction at 150° C. (Mpa) | 17.3 | 28.4 | 28.4 | 28.4 |
|  | Melting point Tm (° C.) | 245 | 248 | 248 | 248 |
|  | Melting point of surface layers (surface I/surface II) Tms (° C.) | 249/249 | 253/253 | 253/253 | 253/253 |
|  | S1(%) | 0.7 | 1.5 | 1.5 | 1.5 |
|  | T1 (° C.) | 80 | 80 | 80 | 80 |
|  | S0(%) | 0.08 | 0.03 | 0.03 | 0.03 |
|  | \|S1 − S0\|/(T1 − 40) | 0.016 | 0.037 | 0.037 | 0.037 |
|  | Sa (mN/m) (surface I/surface II) | 21.3/47.4 | 21.4/47.2 | 21.4/47.2 | 21.4/47.2 |
|  | Sb (mN/m) (surface I/surface II) | 30.8/47.4 | 26.4/47.2 | 22.6/47.2 | 21.5/47.2 |
|  | Sc (mN/m) (surface I/surface II) | 33.9/47.5 | 26.0/47.4 | 22.7/47.4 | 21.4/47.4 |
|  | \|Sa − Sb\| (surface I/surface II) | 9.5/0 | 5.0/0 | 1.2/0 | 0.1/0 |
|  | \|Sa − Sc\| (surface I/surface II) | 12.6/0.1 | 4.6/0.2 | 1.3/0.2 | 0/0.2 |
|  | Surface elastic modulus (MPa) (surface I/surface II) | 1880/3070 | 1910/3041 | 1945/3028 | 1981/3039 |
|  | Root mean square Rq of surface elastic modulus (Mpa) (surface I/surface II) | 501/607 | 366/599 | 385/599 | 398/599 |
|  | Polar force (mN/m) (surface I/surface II) | 1.6/11.0 | 2.1/11.0 | 2.2/11.0 | 2.2/11.0 |
|  | Surface tear elongation (%) at 180° C. | Exceeding 30% | Exceeding 30% | Exceeding 30% | Exceeding 30% |
|  | Piercing strength (N) | 5.8 | 13.8 | 12.9 | 12.8 |
| Evaluation | Followability to mold shape | S | A | A | A |
|  | Releasability | B | S | S | A |
|  | Molding appearance 1 | B | B | B | B |
|  | Molding appearance 2 | C | C | C | C |
|  | Perforability | A | C | C | C |

TABLE 11

|  |  |  | Comparative Example 1 | Comparative Example 2 | Comparative Example 3 |
|---|---|---|---|---|---|
| Film structure | B layer | | Polyester A (70 wt %) Polyester B (30 wt %) | Polyester A (70 wt %) Polyester B (30 wt %) | Polyester A (70 wt %) Polyester B (30 wt %) |
|  | A layer | | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
| Layer structure (thickness (μm) of each layer) | | | A/B/A(5/45/5) | A/B/A(5/45/5) | A/B/A(5/45/5) |
| Film forming conditions | Heat treatment temperature (° C.) | | 240 | 240 | 240 |
|  | Heat treatment time (sec) | | 15 | 15 | 15 |
| Release layer | Release layer | | 1 | 1 | 1 |
|  | Process A | Drying temperature (° C.) | 100 | 100 | 100 |
|  |  | Transport tension (MPa) | 5.3 | 0.6 | 0.2 |
|  |  | Draw setting (%) | 0.40 | 0.40 | 0.40 |
|  | Process B | Drying temperature (° C.) | 110 | 130 | 110 |
|  |  | Transport tension (MPa) | 5.3 | 0.6 | 0.2 |
|  |  | Draw setting (%) | 0.40 | 0.40 | 0.40 |
|  | Thickness (nm) | | 135 | 135 | 135 |
|  | Thickness unevenness (nm) | | 76 | 81 | 79 |

|  |  |  | Comparative Example 4 | Comparative Example 5 |
|---|---|---|---|---|
| Film structure | B layer | | Polyester A (70 wt %) Polyester B (30 wt %) | Polyester A (100 wt %) |
|  | A layer | | Polyester A (89 wt %) Polyester B (10 wt %) Particle master (1 wt %) | Polyester A (99 wt %) Particle master (1 wt %) |
| Layer structure (thickness (μm) of each layer) | | | A/B/A(5/45/5) | A/B/A(5/45/5) |
| Film forming conditions | Heat treatment temperature (° C.) | | 240 | 240 |
|  | Heat treatment time (sec) | | 15 | 15 |
| Release layer | Release layer | | 1 | 1 |
|  | Process A | Drying temperature (° C.) | 100 | 100 |
|  |  | Transport tension (MPa) | 0.6 | 0.6 |
|  |  | Draw setting (%) | 0.40 | 0.40 |
|  | Process B | Drying temperature (° C.) | 110 | 110 |
|  |  | Transport tension (MPa) | 0.6 | 0.6 |
|  |  | Draw setting (%) | 0.40 | 0.40 |

TABLE 11-continued

| | | | |
|---|---|---|---|
| Thickness (nm) | 520 | 135 | |
| Thickness unevenness (nm) | 184 | 75 | |

TABLE 12

| | | Comparative Example 1 | Comparative Example 2 | Comparative Example 3 |
|---|---|---|---|---|
| Film properties | Stress at 10% Extension in Base Film MD Direction at 150° C. (Mpa) | 28.6 | 28.4 | 28.6 |
| | Melting point Tm (° C.) | 248 | 248 | 248 |
| | Melting point of surface layers (surface I/surface II) Tms (° C.) | 253/253 | 253/253 | 253/253 |
| | S1(%) | 0.1 | 1.8 | 1.8 |
| | T1 (° C.) | 41 | 80 | 80 |
| | S0(%) | 0.02 | 0.03 | 0.03 |
| | $|S1 - S0|/(T1 - 40)$ | 0.080 | 0.044 | 0.044 |
| | Sa (mN/m) (surface I/surface II) | 21.5/47.2 | 21.6/47.1 | 21.3/47.4 |
| | Sb (mN/m) (surface I/surface II) | 30.7/47.2 | 30.8/47.1 | 30.1/47.4 |
| | Sc (mN/m) (surface I/surface II) | 31.0/47.4 | 31.1/47.2 | 30.5/47.6 |
| | $|Sa - Sb|$ (surface I/surface II) | 9.2/0 | 9.2/0 | 8.8/0 |
| | $|Sa - Sc|$ (surface I/surface II) | 9.5/0.2 | 9.5/0.1 | 9.2/0.2 |
| | Surface elastic modulus (MPa) (surface I/surface II) | 1901/3038 | 1989/3018 | 1931/3035 |
| | Root mean square Rq of surface elastic modulus (Mpa) (surface I/surface II) | 345/588 | 369/601 | 389/596 |
| | Polar force (mN/m) (surface I/surface II) | 2.1/11.0 | 1.5/11.0 | 2.0/11.0 |
| | Surface tear elongation (%) at 180° C. | Exceeding 30% | Exceeding 30% | Exceeding 30% |
| | Piercing strength (N) | 13.6 | 12.8 | 12.9 |
| Evaluation | Followability to mold shape | C | A | A |
| | Releasability | S | S | S |
| | Molding appearance 1 | C | C | C |
| | Molding appearance 2 | C | C | C |
| | Perforability | C | C | C |

| | | Comparative Example 4 | Comparative Example 5 |
|---|---|---|---|
| Film properties | Stress at 10% Extension in Base Film MD Direction at 150° C. (Mpa) | 28.4 | 34 |
| | Melting point Tm (° C.) | 248 | 254 |
| | Melting point of surface layers (surface I/surface II) Tms (° C.) | 253/253 | 255/255 |
| | S1(%) | 1.5 | 2.1 |
| | T1 (° C.) | 80 | 85 |
| | S0(%) | 0.03 | 0 |
| | $|S1 - S0|/(T1 - 40)$ | 0.037 | 0.047 |
| | Sa (mN/m) (surface I/surface II) | 21.1/47.5 | 21.3/47.6 |
| | Sb (mN/m) (surface I/surface II) | 36.7/47.5 | 30.9/47.6 |
| | Sc (mN/m) (surface I/surface II) | 37.1/47.7 | 31.6/47.7 |
| | $|Sa - Sb|$ (surface I/surface II) | 15.6/0 | 9.6/0 |
| | $|Sa - Sc|$ (surface I/surface II) | 16.0/0.2 | 10.3/0.1 |
| | Surface elastic modulus (MPa) (surface I/surface II) | 2010/3036 | 2219/3065 |
| | Root mean square Rq of surface elastic modulus (Mpa) (surface I/surface II) | 399/608 | 393/621 |
| | Polar force (mN/m) (surface I/surface II) | 1.8/11.0 | 1.9/11.0 |
| | Surface tear elongation (%) at 180° C. | Exceeding 30% | Exceeding 30% |
| | Piercing strength (N) | 12.7 | 21.5 |
| Evaluation | Followability to mold shape | A | C |
| | Releasability | C | S |
| | Molding appearance 1 | B | C |
| | Molding appearance 2 | C | B |
| | Perforability | C | C |

TABLE 13

| | | | Example 34 | Example 35 | Example 36 | Example 37 |
|---|---|---|---|---|---|---|
| Film structure | | B layer | Polyester A (70 wt %) Polyester B (30 wt %) | Polyester A (70 wt %) Polyester B (30 wt %) | Polyester A (60 wt %) Polyester B (40 wt %) | Polyester A (70 wt %) Polyester B (30 wt %) |

TABLE 13-continued

|  |  |  |  |  |  |  |
|---|---|---|---|---|---|---|
|  | A layer |  | Polyester A (89 wt %) Polyester B (10 wt %) Particle master (1 wt %) | Polyester A (89 wt %) Polyester B (10 wt %) Particle master (1 wt %) | Polyester A (79 wt %) Polyester B (10 wt %) Particle master (1 wt %) | Polyester A (89 wt %) Polyester B (10 wt %) Particle master (1 wt %) |
| Layer structure (thickness (μm) of each layer) |  |  | A/B/A(5/45/5) | A/B/A(5/45/5) | A/B/A(5/45/5) | A/B/A(5/45/5) |
| Film forming conditions | Heat treatment temperature (° C.) |  | 240 | 240 | 240 | 240 |
|  | Heat treatment time (sec) |  | 15 | 15 | 15 | 15 |
| Release layer | Release layer |  | 1 | 1 | 1 | 13 |
|  | Process A | Drying temperature (° C.) | 100 | 100 | 100 | 100 |
|  |  | Transport tension (MPa) | 0.6 | 0.6 | 0.6 | 0.6 |
|  |  | Draw setting (%) | 0.55 | 1.00 | 2.40 | 0.40 |
|  | Process B | Drying temperature (° C.) | 110 | 110 | 110 | 110 |
|  |  | Transport tension (MPa) | 0.6 | 0.6 | 0.6 | 0.6 |
|  |  | Draw setting (%) | 0.55 | 1.00 | 2.40 | 0.40 |
|  | Thickness (nm) |  | 135 | 135 | 135 | 135 |
|  | Thickness unevenness (nm) |  | 42 | 30 | 48 | 72 |

|  |  |  | Example 38 | Example 39 | Example 40 |
|---|---|---|---|---|---|
| Film structure | B layer |  | Polyester A (70 wt %) Polyester B (30 wt %) | Polyester A (70 wt %) Polyester B (30 wt %) | Polyester A (70 wt %) Polyester B (30 wt %) |
|  | A layer |  | Polyester A (89 wt %) Polyester B (10 wt %) Particle master (1 wt %) | Polyester A (89 wt %) Polyester B (10 wt %) Particle master (1 wt %) | Polyester A (89 wt %) Polyester B (10 wt %) Particle master (1 wt %) |
| Layer structure (thickness (μm) of each layer) |  |  | A/B/A(5/45/5) | A/B/A(5/45/5) | A/B/A(5/45/5) |
| Film forming conditions | Heat treatment temperature (° C.) |  | 240 | 240 | 240 |
|  | Heat treatment time (sec) |  | 15 | 15 | 15 |
| Release layer | Release layer |  | 14 | 14 | 11 |
|  | Process A | Drying temperature (° C.) | 100 | 100 | 100 |
|  |  | Transport tension (MPa) | 0.6 | 0.6 | 0.6 |
|  |  | Draw setting (%) | 0.40 | 0.40 | 0.40 |
|  | Process B | Drying temperature (° C.) | 110 | 110 | 110 |
|  |  | Transport tension (MPa) | 0.6 | 0.6 | 0.6 |
|  |  | Draw setting (%) | 0.40 | 0.40 | 0.40 |
|  | Thickness (nm) |  | 135 | 180 | 350 |
|  | Thickness unevenness (nm) |  | 72 | 91 | 168 |

TABLE 14

|  |  | Example 34 | Example 35 | Example 36 | Example 37 |
|---|---|---|---|---|---|
| Film properties | Stress at 10% Extension in Base Film MD Direction at 150° C. (Mpa) | 28.4 | 28.8 | 28.7 | 28.3 |
|  | Melting point Tm (° C.) | 248 | 248 | 248 | 248 |
|  | Melting point of surface layers (surface I/surface II) Tms (° C.) | 253/253 | 253/253 | 253/253 | 253/253 |
|  | S1(%) | 1.5 | 1.4 | 1.4 | 1.5 |
|  | T1 (° C.) | 80 | 80 | 80 | 80 |
|  | S0(%) | 0.03 | 0.03 | 0.03 | 0.03 |
|  | \|S1 − S0\|/(T1 − 40) | 0.037 | 0.034 | 0.034 | 0.037 |
|  | Sa (mN/m) (surface I/surface II) | 21.5/47.0 | 22.0/47.0 | 22.0/47.0 | 24.0/47.1 |
|  | Sb (mN/m) (surface I/surface II) | 31.5/47.1 | 32.3/47.1 | 32.3/47.1 | 33.6/47.1 |
|  | Sc (mN/m) (surface I/surface II) | 32.6/47.2 | 32.9/47.2 | 32.9/47.2 | 38.7/47.5 |
|  | \|Sa − Sb\| (surface I/surface II) | 10.0/0.1 | 10.3/0.1 | 10.3/0.1 | 9.6/0 |
|  | \|Sa − Sc\| (surface I/surface II) | 11.1/0.2 | 10.9/0.2 | 10.9/0.2 | 14.7/0.4 |
|  | Surface elastic modulus (MPa) (surface I/surface II) | 1888/3021 | 1876/3029 | 1876/3029 | 1891/3049 |
|  | Root mean square Rq of surface elastic modulus (Mpa) (surface I/surface II) | 357/619 | 343/618 | 343/618 | 382/622 |
|  | Polar force (mN/m) (surface I/surface II) | 1.8/11.0 | 1.8/11.0 | 1.8/11.0 | 2.3/11.0 |
|  | Surface tear elongation (%) at 180° C. | Exceeding 30% | Exceeding 30% | Exceeding 30% | 27.0 |
|  | Piercing strength (N) | 12.2 | 12.2 | 12.2 | 12.4 |
| Evaluation | Followability to mold shape | A | A | A | A |
|  | Releasability | S | S | S | S |
|  | Molding appearance 1 | A | S | A | A |
|  | Molding appearance 2 | C | C | C | C |
|  | Perforability | C | C | C | C |

|  |  | Example 38 | Example 39 | Example 40 |
|---|---|---|---|---|
| Film properties | Stress at 10% Extension in Base Film MD Direction at 150° C. (Mpa) | 28.3 | 28.3 | 28.4 |
|  | Melting point Tm (° C.) | 248 | 248 | 248 |
|  | Melting point of surface layers (surface I/surface II) Tms (° C.) | 253/253 | 253/253 | 253/253 |
|  | S1(%) | 1.5 | 1.5 | 1.5 |
|  | T1 (° C.) | 80 | 80 | 80 |
|  | S0(%) | 0.03 | 0.03 | 0.03 |
|  | \|S1 − S0\|/(T1 − 40) | 0.037 | 0.037 | 0.037 |
|  | Sa (mN/m) (surface I/surface II) | 22.1/47.3 | 22.1/47.3 | 24.1/47.2 |
|  | Sb (mN/m) (surface I/surface II) | 22.3/47.1 | 22.5/47.1 | 24.8/47.2 |
|  | Sc (mN/m) (surface I/surface II) | 35.8/47.5 | 35.9/47.5 | 36.3/47.4 |
|  | \|Sa − Sb\| (surface I/surface II) | 0.2/0.2 | 0.4/0.2 | 0.7/0 |
|  | \|Sa − Sc\| (surface I/surface II) | 13.7/0.4 | 13.8/0.4 | 12.2/0.2 |
|  | Surface elastic modulus (MPa) (surface I/surface II) | 1800/3033 | 1781/3030 | 1945/3028 |
|  | Root mean square Rq of surface elastic modulus (Mpa) (surface I/surface II) | 366/628 | 377/627 | 385/599 |
|  | Polar force (mN/m) (surface I/surface II) | 1.9/11.0 | 1.9/11.0 | 2.2/11.0 |
|  | Surface tear elongation (%) at 180° C. | 19.0 | 2.3 | 0.0 |
|  | Piercing strength (N) | 12.5 | 12.5 | 12.9 |
| Evaluation | Followability to mold shape | A | A | A |
|  | Releasability | S | S | B |
|  | Molding appearance 1 | S | A | B |
|  | Molding appearance 2 | C | C | C |
|  | Perforability | C | C | C |

TABLE 15

|  |  | Example 41 | Example 42 | Example 43 | Example 44 |
|---|---|---|---|---|---|
| Film structure | B layer | Polyester A (70 wt %) Polyester B (30 wt %) | Polyester A (70 wt %) Polyester B (30 wt %) | Polyester A (70 wt %) Polyester B (30 wt %) | Polyester A (70 wt %) Polyester B (30 wt %) |
|  | A layer | Polyester A (89 wt %) Polyester D (10 wt %) Particle master (1 wt %) | Polyester A (89 wt %) Polyester E (10 wt %) Particle master (1 wt %) | Polyester A (89 wt %) Polyester F (10 wt %) Particle master (1 wt %) | Polyester A (89 wt %) Polyester G (10 wt %) Particle master (1 wt %) |

TABLE 15-continued

| Layer structure (thickness (μm) of each layer) | | | A/B/A(5/45/5) | A/B/A(5/45/5) | A/B/A(5/45/5) | A/B/A(5/45/5) |
|---|---|---|---|---|---|---|
| Film forming conditions | Heat treatment temperature (° C.) | | 240 | 240 | 240 | 240 |
| | Heat treatment time (sec) | | 15 | 15 | 15 | 15 |
| Release layer | Release layer | | 1 | 1 | 1 | 1 |
| | Process A | Drying temperature (° C.) | 100 | 100 | 100 | 100 |
| | | Transport tension (MPa) | 0.6 | 0.6 | 0.6 | 0.6 |
| | | Draw setting (%) | 0.40 | 0.40 | 0.40 | 0.40 |
| | Process B | Drying temperature (° C.) | 110 | 110 | 110 | 110 |
| | | Transport tension (MPa) | 0.6 | 0.6 | 0.6 | 0.6 |
| | | Draw setting (%) | 0.40 | 0.40 | 0.40 | 0.40 |
| | Thickness (nm) | | 135 | 135 | 135 | 135 |
| | Thickness unevenness (nm) | | 71 | 72 | 69 | 66 |

| | | | Example 45 | Example 46 | Example 47 |
|---|---|---|---|---|---|
| Film structure | B layer | | Polyester A (70 wt %) Polyester B (30 wt %) | Polyester A (60 wt %) Polyester B (40 wt %) | Polyester A (70 wt %) Polyester B (30 wt %) |
| | A layer | | Polyester A (89 wt %) Polyetherimide (10 wt %) Particle master (1 wt %) | Polyester A (79 wt %) Polyester B (20 wt %) Particle master (1 wt %) | Polyester A (89 wt %) Polyester F (10 wt %) Particle master (1 wt %) |
| Layer structure (thickness (μm) of each layer) | | | A/B/A(5/45/5) | A/B/A(5/45/5) | 387 Layers |
| Film forming conditions | Heat treatment temperature (° C.) | | 240 | 240 | 240 |
| | Heat treatment time (sec) | | 15 | 15 | 15 |
| Release layer | Release layer | | 1 | 1 | 1 |
| | Process A | Drying temperature (° C.) | 100 | 100 | 100 |
| | | Transport tension (MPa) | 0.6 | 0.6 | 0.6 |
| | | Draw setting (%) | 0.40 | 0.40 | 0.40 |
| | Process B | Drying temperature (° C.) | 110 | 110 | 110 |
| | | Transport tension (MPa) | 0.6 | 0.6 | 0.6 |
| | | Draw setting (%) | 0.40 | 0.40 | 0.40 |
| | Thickness (nm) | | 135 | 135 | 135 |
| | Thickness unevenness (nm) | | 72 | 71 | 69 |

TABLE 16

| | | Example 41 | Example 42 | Example 43 | Example 44 |
|---|---|---|---|---|---|
| Film properties | Stress at 10% Extension in Base Film MD Direction at 150° C. (Mpa) | 29.6 | 28.3 | 26.4 | 28 |
| | Melting point Tm (° C.) | 248 | 249 | 248 | 249 |
| | Melting point of surface layers (surface I/surface II) Tms (° C.) | 256/256 | 257/257 | 256/256 | 261/261 |
| | S1(%) | 1.5 | 1.4 | 1.4 | 1.4 |
| | T1 (° C.) | 80 | 80 | 80 | 80 |
| | S0(%) | 0.03 | 0.03 | 0.03 | 0.03 |
| | \|S1 − S0\|/(T1 − 40) | 0.037 | 0.034 | 0.034 | 0.034 |
| | Sa (mN/m) (surface I/surface II) | 21.8/47.1 | 21.6/47.0 | 21.7/47.8 | 22.0/47.3 |

TABLE 16-continued

|  |  |  |  |  |  |
|---|---|---|---|---|---|
|  | Sb (mN/m) (surface I/surface II) | 32.1/47.1 | 32.0/47.0 | 30.8/47.9 | 30.9/47.5 |
|  | Sc (mN/m) (surface I/surface II) | 32.8/47.1 | 33.3/47.2 | 32.5/47.9 | 32.1/47.3 |
|  | \|Sa − Sb\| (surface I/surface II) | 10.3/0 | 10.4/0 | 9.1/0.1 | 8.9/0.2 |
|  | \|Sa − Sc\| (surface I/surface II) | 11.0/0 | 11.7/0.2 | 10.8/0.1 | 10.1/0 |
|  | Surface elastic modulus (MPa) (surface I/surface II) | 1906/3058 | 1954/3086 | 1931/3078 | 1929/3153 |
|  | Root mean square Rq of surface elastic modulus (Mpa) (surface I/surface II) | 385/616 | 377/625 | 380/641 | 376/653 |
|  | Polar force (mN/m) (surface I/surface II) | 1.8/11.0 | 1.8/11.0 | 1.8/11.0 | 1.8/11.0 |
|  | Surface tear elongation (%) at 180° C. | Exceeding 30% | Exceeding 30% | Exceeding 30% | Exceeding 30% |
|  | Piercing strength (N) | 14.3 | 14.1 | 12.9 | 12.9 |
| Evaluation | Followability to mold shape | A | A | A | A |
|  | Releasability | S | S | S | S |
|  | Molding appearance 1 | B | B | B | B |
|  | Molding appearance 2 | B | B | A | A |
|  | Perforability | C | C | C | C |

|  |  | Example 45 | Example 46 | Example 47 |
|---|---|---|---|---|
| Film properties | Stress at 10% Extension in Base Film MD Direction at 150° C. (Mpa) | 29.3 | 17.3 | 25.4 |
|  | Melting point Tm (° C.) | 249 | 245 | 248 |
|  | Melting point of surface layers (surface I/surface II) Tms (° C.) | 253/253 | 249/249 | 256/256 |
|  | S1(%) | 1.5 | 0.7 | 1.4 |
|  | T1 (° C.) | 80 | 80 | 80 |
|  | S0(%) | 0.03 | 0.08 | 0.03 |
|  | \|S1 − S0\|/(T1 − 40) | 0.037 | 0.016 | 0.034 |
|  | Sa (mN/m) (surface I/surface II) | 21.6/47.5 | 21.6/47.5 | 22.3/47.8 |
|  | Sb (mN/m) (surface I/surface II) | 31.1/47.6 | 31.1/47.8 | 31.0/47.9 |
|  | Sc (mN/m) (surface I/surface II) | 34.3/47.6 | 33.4/47.8 | 31.3/48.0 |
|  | \|Sa − Sb\| (surface I/surface II) | 9.5/0.1 | 9.5/0.3 | 8.7/0.1 |
|  | \|Sa − Sc\| (surface I/surface II) | 12.7/0.1 | 11.8/0.3 | 9.0/0.2 |
|  | Surface elastic modulus (MPa) (surface I/surface II) | 1873/3015 | 1880/3031 | 1921/3044 |
|  | Root mean square Rq of surface elastic modulus (Mpa) (surface I/surface II) | 371/615 | 373/634 | 373/641 |
|  | Polar force (mN/m) (surface I/surface II) | 1.8/11.0 | 1.8/11.0 | 1.8/11.0 |
|  | Surface tear elongation (%) at 180° C. | Exceeding 30% | Exceeding 30% | Exceeding 30% |
|  | Piercing strength (N) | 12.5 | 5.4 | 12.9 |
| Evaluation | Followability to mold shape | A | S | A |
|  | Releasability | S | S | S |
|  | Molding appearance 1 | B | S | A |
|  | Molding appearance 2 | S | S | A |
|  | Perforability | C | A | C |

INDUSTRIAL APPLICABILITY

Our release film can suppress generation of wrinkles during heating since the dimensional change rate and its change when the temperature is raised from room temperature to 200° C. are small. Also, since the change in surface free energy after heat treatment and heat elongation is small, the release film is excellent in peelability after high-temperature molding and suitable as a release film for a circuit manufacturing process or a semiconductor manufacturing process, and can be particularly suitably used as a release film for a semiconductor sealing process.

The invention claimed is:

1. A process release film, wherein formulas (I) and (II) are satisfied when a maximum dimensional change rate from 30° C. to 150° C. at a time of raising a temperature from 30° C. to 200° C. at 10° C./min, as measured by thermomechanical analysis (TMA), is defined as S1 (%), a temperature at which S1 is given is defined as T1 (° C.), and a dimensional change rate at 40° C. is defined as S0 (%), and a surface free energy Sa (mN/mm) at 25° C., a surface free energy Sb (mN/mm) after being subjected to a heat treatment at 180° C. for 3 minutes, and a surface free energy Sc (mN/mm) after elongation of 50% at 180° C. satisfy formulas (III) and (IV) on at least one surface of the film:

$$0 \le S1 \le 1.5 \quad (I);$$

$$0 \le |S1 - S0|/(T1 - 40) \le 0.050 \quad (II);$$

$$0 \le |Sa - Sb| \le 15 \quad (III); \text{ and}$$

$$0 \le |Sa - Sc| \le 15 \quad (IV).$$

2. The process release film according to claim 1, wherein a surface elastic modulus on at least one surface as measured using an atomic force microscope is 50 to 3000 MPa.

3. The process release film according to claim 1, wherein a root mean square (Rq) of the surface elastic modulus on at least one surface is 50 to 500 MPa.

4. The process release film according to claim 1, wherein a maximum temperature of a melting peak (Tm) observed by a differential scanning calorimeter (DSC) is 240° C. or more and 265° C. or less.

5. The process release film according to claim 1, wherein a polar force of film surface on at least one surface is 0.1 mN/m or more and 5.0 mN/m or less.

6. The process release film according to claim 1, comprising a release layer with a thickness of 50 nm or more and 500 nm or less on at least one surface.

7. The process release film according to claim 6, wherein a thickness unevenness of the release layer is 50 nm or less.

8. The process release film according to claim 1, wherein a surface tear elongation at 180° C. is more than 0% and 30% or less.

9. The process release film according to claim 1, wherein a piercing strength is 2 N or more and 10 N or less.

10. The process release film according to claim 1, which is a laminated polyester film having a polyester A layer and a polyester B layer having a lower melting point than the polyester A layer, and the polyester A layer and the polyester B layer are alternately laminated 3 layers or more and 1000 layers or less.

11. The process release film according to claim 10, wherein the polyester A layer contains a polyester containing at least one copolymer component selected from the group consisting of bisphenol A ethylene oxide, spiroglycol, cyclohexanedicarboxylic acid, and naphthalenedicarboxylic acid, and/or polyetherimide.

12. The process release film according to claim 1, comprising a polyester A layer with a thickness of 3 µm or more and 10 µm or less within a thickness of 10 µm or less from an outermost surface of the film.

13. The process release film according to claim 1, which is a process film in semiconductor manufacture.

14. The process release film according to claim 1, for semiconductor compression mold molding.

* * * * *